(12) United States Patent
Wang et al.

(10) Patent No.: US 11,823,955 B2
(45) Date of Patent: *Nov. 21, 2023

(54) MULTI-LAYERED INSULATING FILM STACK

(71) Applicant: Taiwan Semiconductor Manufacturing Co., Ltd., Hsinchu (TW)

(72) Inventors: Chieh-Ping Wang, Taichung (TW); Ting-Gang Chen, Taipei (TW); Bo-Cyuan Lu, New Taipei (TW); Tai-Chun Huang, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/663,321

(22) Filed: May 13, 2022

(65) Prior Publication Data

US 2022/0278000 A1 Sep. 1, 2022

Related U.S. Application Data

(63) Continuation of application No. 17/023,486, filed on Sep. 17, 2020, now Pat. No. 11,335,603.
(Continued)

(51) Int. Cl.
*H01L 21/8234* (2006.01)
*H01L 21/28* (2006.01)
(Continued)

(52) U.S. Cl.
CPC .. *H01L 21/823481* (2013.01); *H01L 21/0217* (2013.01); *H01L 21/02164* (2013.01);
(Continued)

(58) Field of Classification Search
CPC ........... H01L 21/02164; H01L 21/0217; H01L 21/28123; H01L 21/31111;
(Continued)

(56) References Cited

U.S. PATENT DOCUMENTS 10,418,284 B2    9/2019   Lee et al.
10,930,749 B2    2/2021   Jeon et al.
(Continued)

FOREIGN PATENT DOCUMENTS

DE      102018106170 A1    2/2019
KR      20170012640 A      2/2017
(Continued)

*Primary Examiner* — Cheung Lee
(74) *Attorney, Agent, or Firm* — Slater Matsil, LLP

(57) ABSTRACT

A method for forming a semiconductor device includes: forming a gate structure over a fin, where the fin protrudes above a substrate; forming an opening in the gate structure; forming a first dielectric layer along sidewalls and a bottom of the opening, where the first dielectric layer is non-conformal, where the first dielectric layer has a first thickness proximate to an upper surface of the gate structure distal from the substrate, and has a second thickness proximate to the bottom of the opening, where the first thickness is larger than the second thickness; and forming a second dielectric layer over the first dielectric layer to fill the opening, where the first dielectric layer is formed of a first dielectric material, and the second dielectric layer is formed of a second dielectric material different from the first dielectric material.

20 Claims, 28 Drawing Sheets

Related U.S. Application Data

(60) Provisional application No. 63/044,622, filed on Jun. 26, 2020.

(51) Int. Cl.
    *H01L 27/088*     (2006.01)
    *H01L 29/06*     (2006.01)
    *H01L 21/02*     (2006.01)
    *H01L 21/311*     (2006.01)
    *H01L 21/764*     (2006.01)
    *H01L 21/762*     (2006.01)
    *H01L 29/66*     (2006.01)
    *H01L 29/78*     (2006.01)

(52) U.S. Cl.
    CPC .. *H01L 21/28123* (2013.01); *H01L 21/31111* (2013.01); *H01L 21/31116* (2013.01); *H01L 21/762* (2013.01); *H01L 21/764* (2013.01); *H01L 21/823431* (2013.01); *H01L 21/823437* (2013.01); *H01L 27/0886* (2013.01); *H01L 29/0649* (2013.01); *H01L 29/66795* (2013.01); *H01L 29/785* (2013.01)

(58) Field of Classification Search
    CPC ............. H01L 21/31116; H01L 21/762; H01L 21/764; H01L 21/823431; H01L 21/823437; H01L 21/823481; H01L 21/823821; H01L 21/823878; H01L 27/0886; H01L 27/0922; H01L 29/0649; H01L 29/66795; H01L 29/785; H01L 21/02274; H01L 21/0228; H01L 29/78696
    See application file for complete search history.

(56) References Cited

U.S. PATENT DOCUMENTS

| | | |
|---|---|---|
| 2019/0157090 A1 | 5/2019 | Jang et al. |
| 2019/0164844 A1 | 5/2019 | Huang et al. |
| 2019/0165155 A1 | 5/2019 | Chang et al. |
| 2019/0305099 A1 | 10/2019 | Jo et al. |
| 2020/0051867 A1 | 2/2020 | Al-Amoody et al. |
| 2020/0185266 A1 | 6/2020 | Zang et al. |

FOREIGN PATENT DOCUMENTS

| | | |
|---|---|---|
| KR | 20190062131 A | 6/2019 |
| KR | 20190112910 A | 10/2019 |
| KR | 20190140647 A | 12/2019 |
| TW | 202013509 A | 4/2020 |

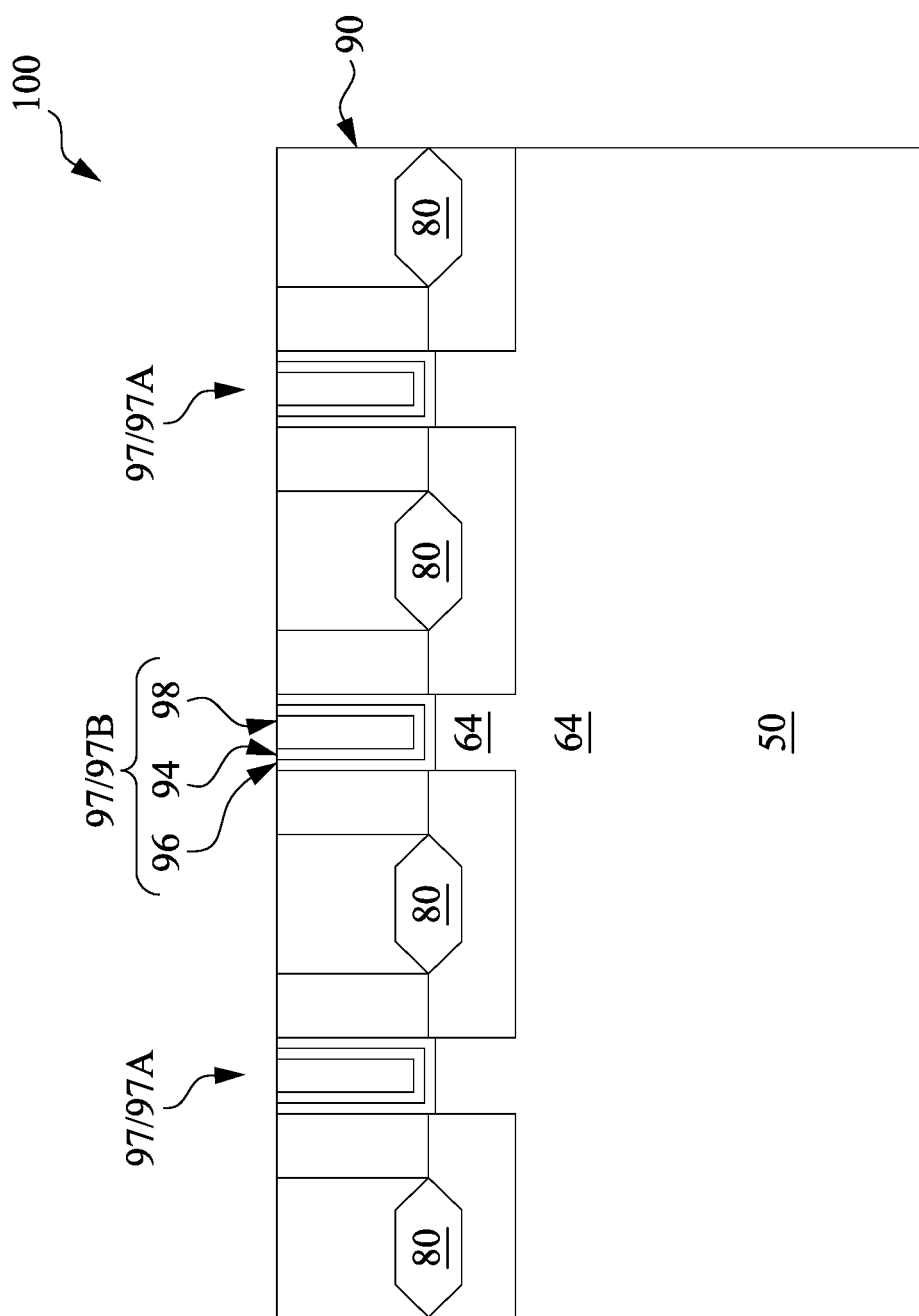

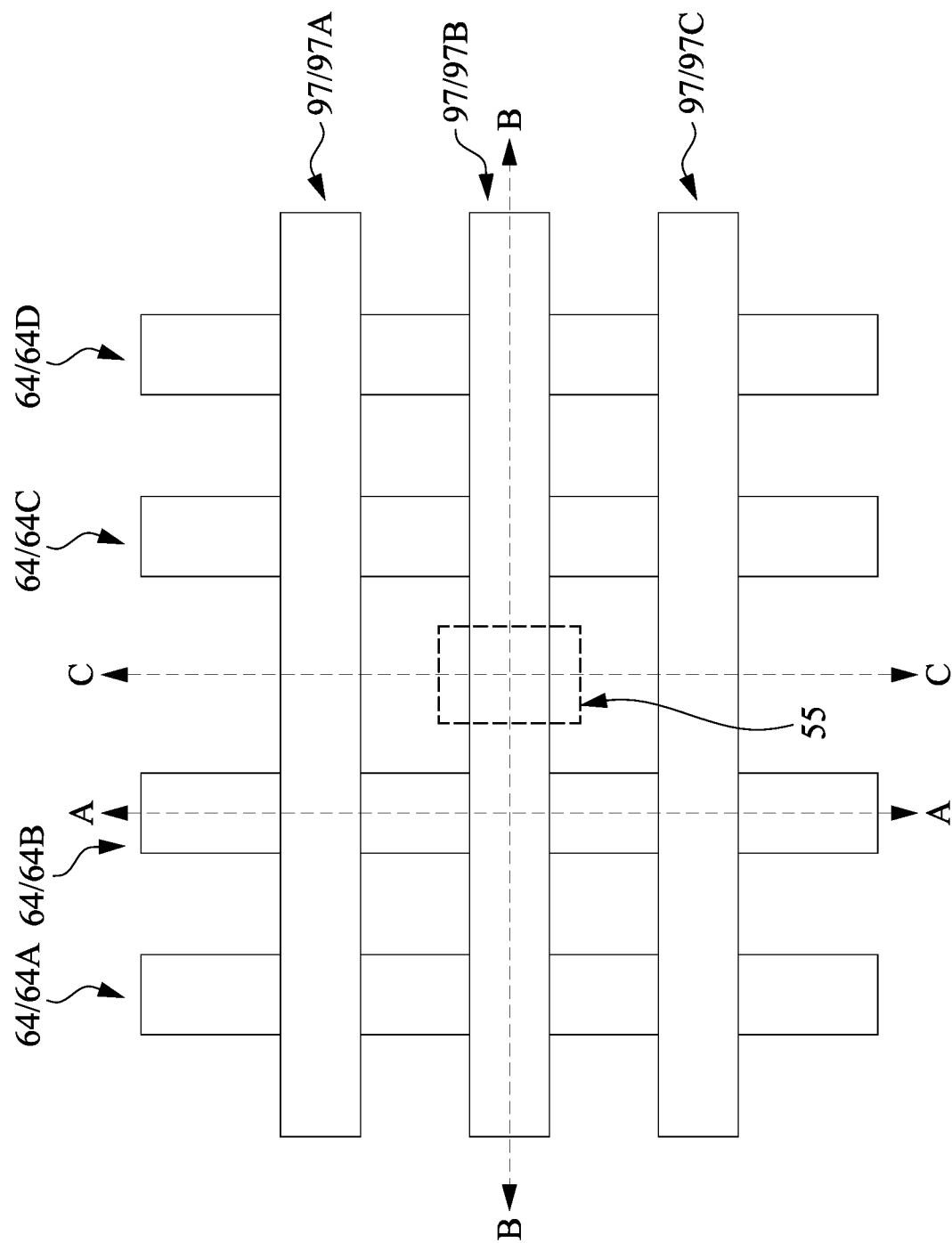

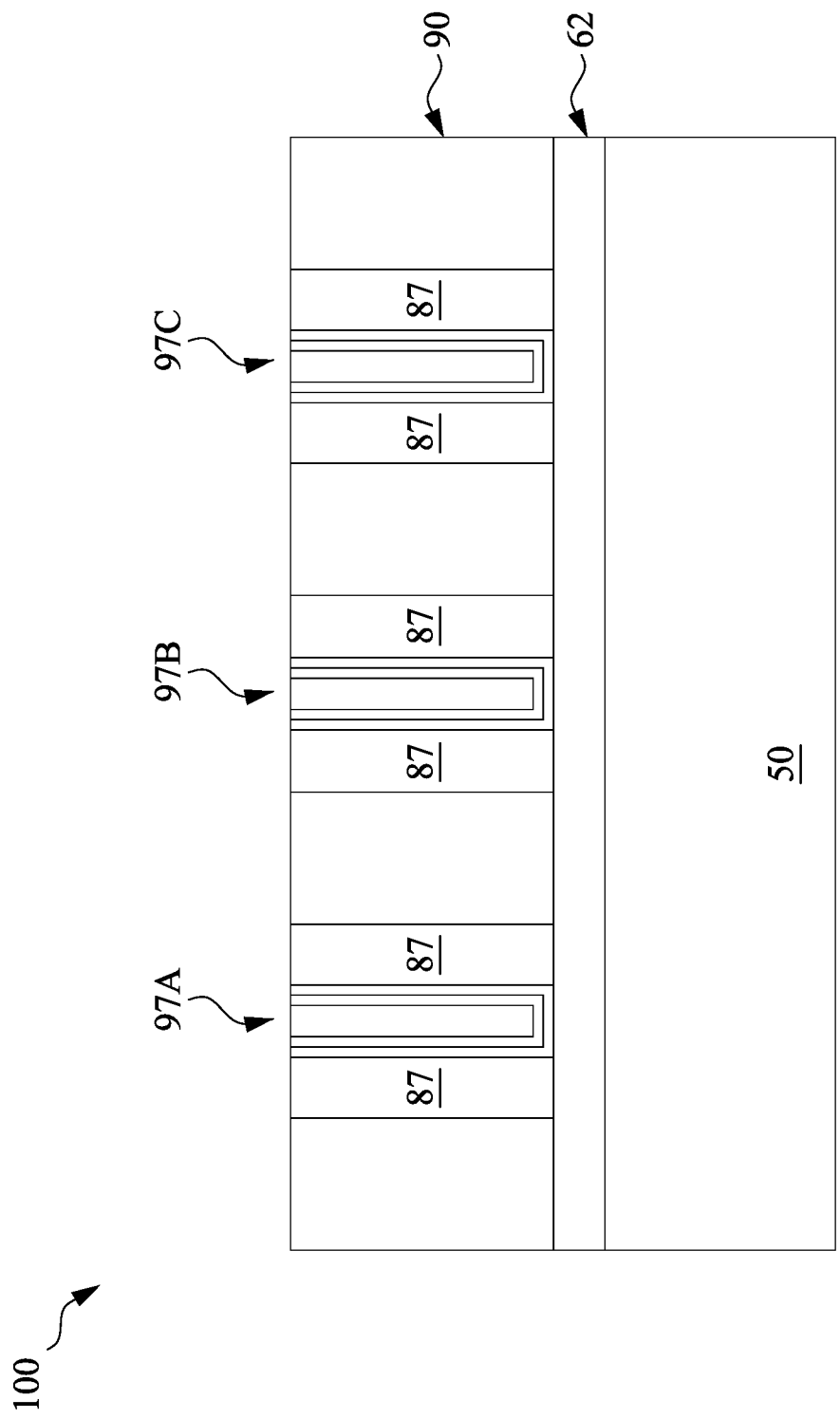

MULTI-LAYERED INSULATING FILM STACK

PRIORITY CLAIM AND CROSS-REFERENCE

This application is a continuation of U.S. patent application Ser. No. 17/023,486, filed Sep. 17, 2020, entitled "Multi-Layered Insulating Film Stack," which claims priority to U.S. Provisional Patent Application No. 63/044,622, filed Jun. 26, 2020, entitled "Balancing Dielectric Constant Between Trench Top and Trench Bottom by Novel Dielectric Film Stack, and Novel Selective Dielectric Film Stack for Improving Device Leakage and RC Delay Time," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-5, 6A-6C, 7A-7D, 8A, 8B, 9A, 9B, 10A, 10B, 11A, and 11B illustrate various views of a FinFET device at various stages of fabrication, in accordance with an embodiment.

DETAILED DESCRIPTION

Figure 1:
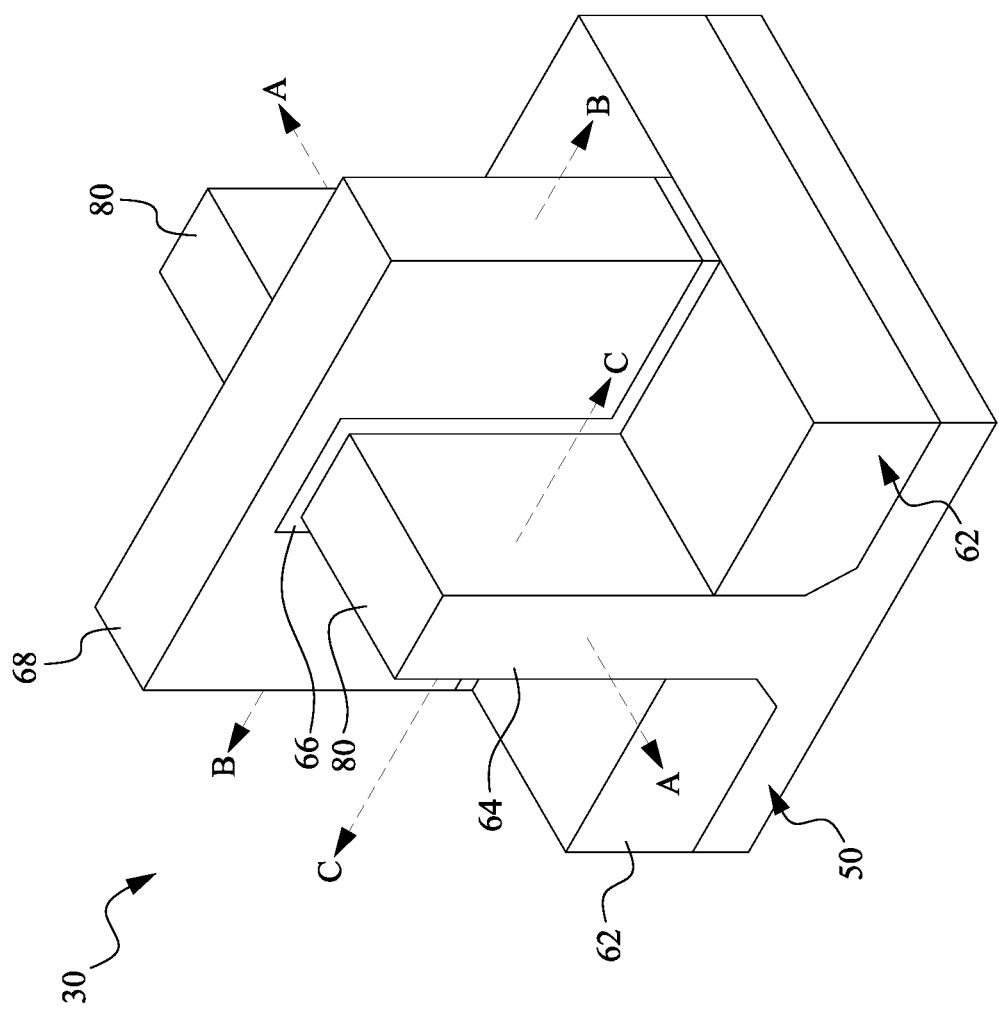
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar numeral in different figures refers to the same or similar element formed by a same or similar formation method using a same or similar material(s). In addition, figures with the same numeral but different alphabets (e.g., FIGS. 8A and 8B) illustrate different views (e.g., cross-sectional views along different cross-sections) of the same device at a same stage of fabrication.

Embodiments of the present disclosure are discussed in the context of forming a multi-layered insulating film stack as a gap filling dielectric structure. Although the disclosed embodiments are discussed in front-end-of-line (FEOL) processing of Fin Field-Effect Transistor (FinFET) devices as examples, principles of the disclosed embodiments may be used in other types of devices (e.g., planar devices) and/or in other manufacturing stages, such as back-end-of-line (BEOL) processing.

In some embodiments, a multi-layered insulating film stack is formed to fill a gap or an opening, such as an opening that separates two metal gates in a metal gate cutting process. The multi-layered insulating film stack includes a first dielectric layer (e.g., SiN) lining sidewalls and a bottom of the opening. The first dielectric layer is non-conformal, and is thicker at the upper portion of the opening than at the bottom of the opening. A second dielectric layer (e.g., $SiO_2$), which has a lower dielectric constant than the first dielectric layer, is formed over the first dielectric layer to fill the opening. In some embodiments, before the second dielectric layer is formed, the first dielectric layer is processed by a plasma process to treat a bottom portion of the first dielectric layer, and the treated bottom portion of the first dielectric layer is removed by a wet etch process to reduce the fixed charges in the second dielectric layer at the bottom of the opening, and to leave more room for forming the second dielectric layer. The disclosed embodiments reduce the overall dielectric constant of the multi-layered insulating film stack to reduce the RC delay. The non-conformal first dielectric layer may further help to balance the parasitic capacitance between neighboring metal gates to reduce threshold voltage variation. Furthermore, by reducing the fixed charges at the bottom of the opening, device leakage is advantageously reduced.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

Figure 6A:
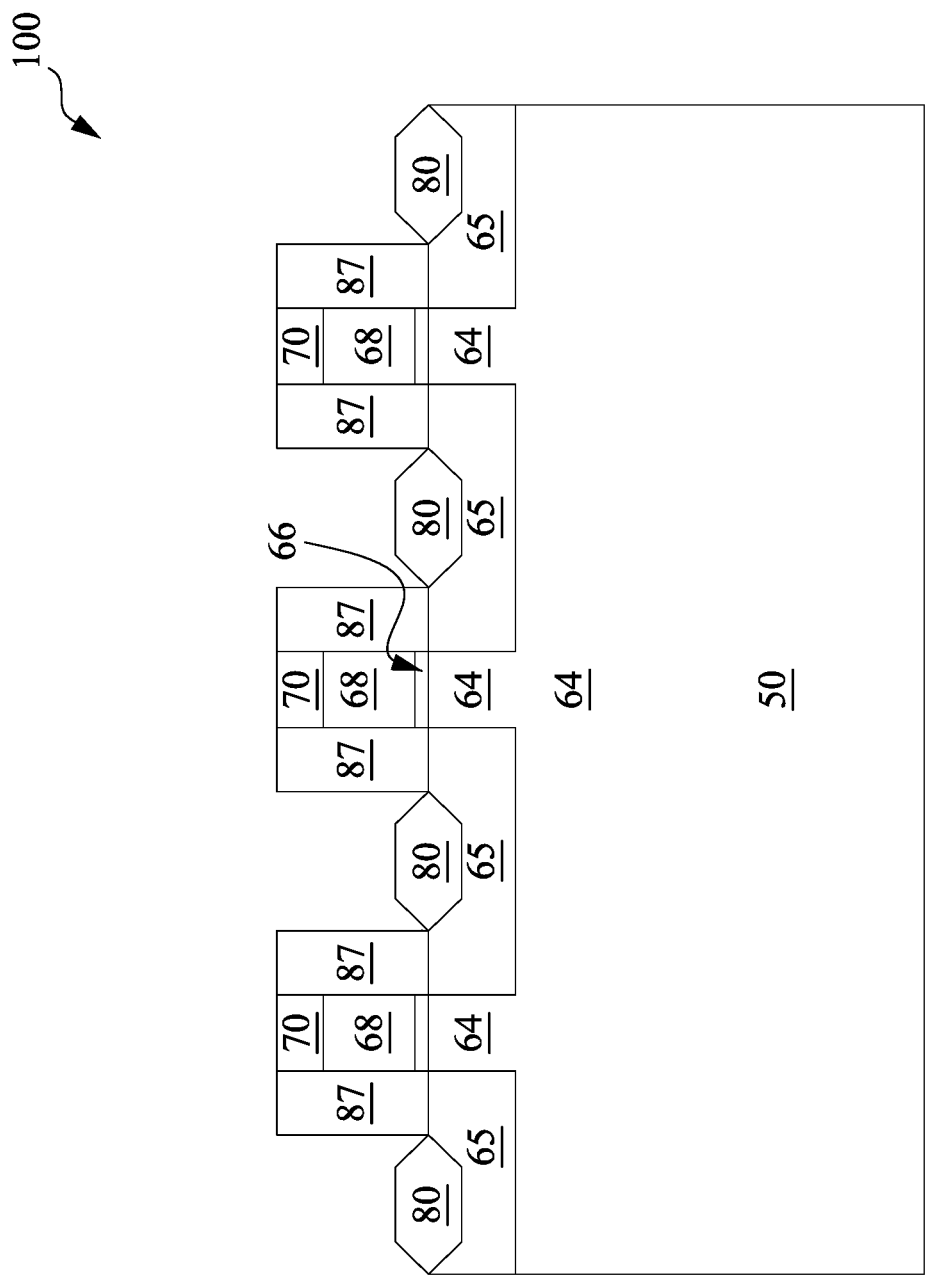
Figure 6B:
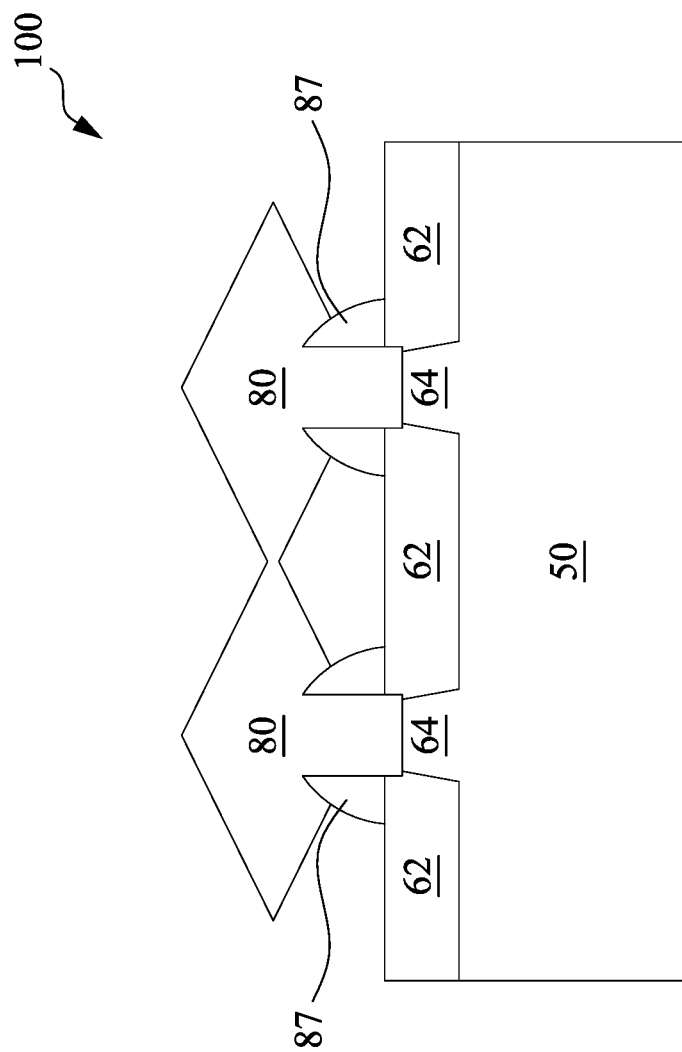
Figure 6C:
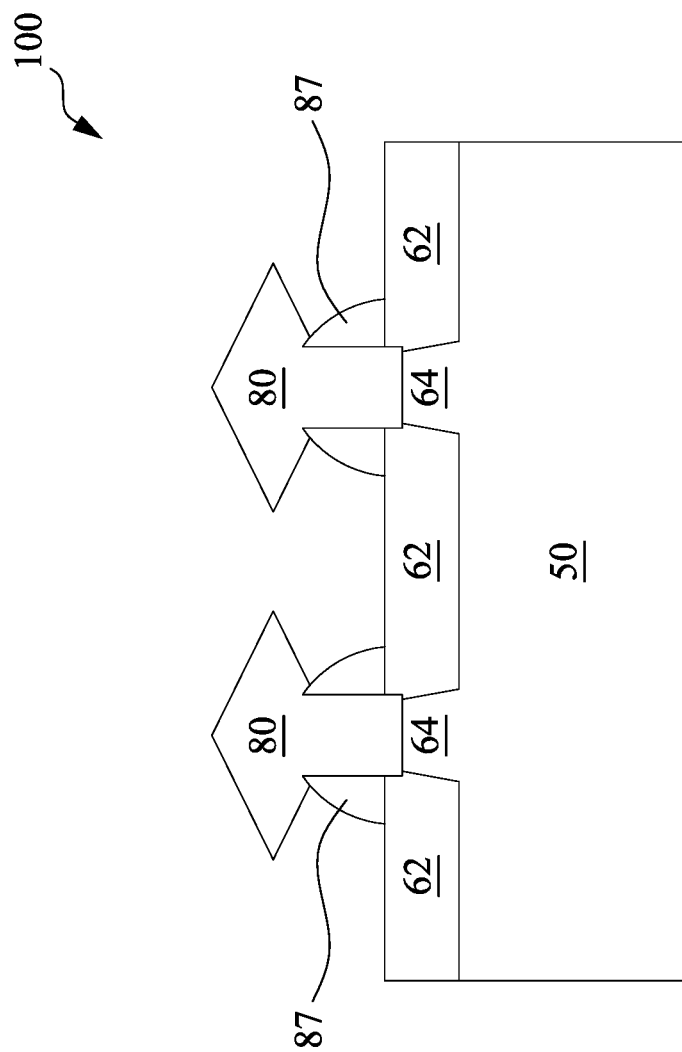
Figure 7C:
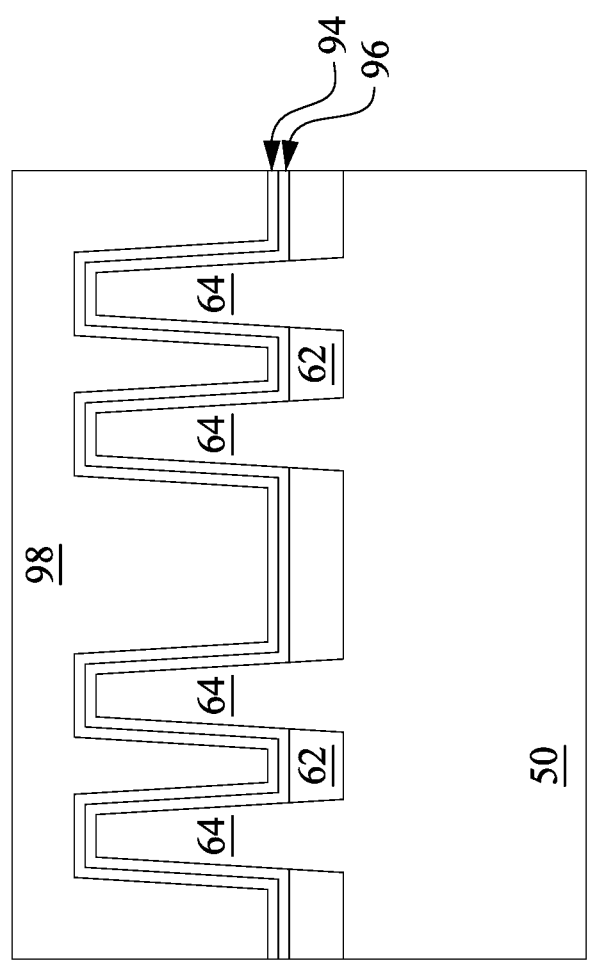

FIGS. 2-5, 6A-6C, 7A-7D, 8A, 8B, 9A, 9B, 10A, 10B, 11A, and 11B illustrate various views of a FinFET device 100 at various stages of fabrication, in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIG. 6A illustrates a cross-sectional view of the FinFET device 100 along cross-section A-A, and FIGS. 6B and 6C illustrate cross-sectional views along cross-section C-C. FIG. 7A illustrates a cross-sectional view of the FinFET device 100 along cross-section A-A, FIG. 7B illustrates a plan view of the FinFET device 100, FIG. 7C illustrates a cross-sectional view along cross-section B-B, and FIG. 7D illustrates a cross-sectional view along cross-section C-C. FIGS. 8A, 9A, 10A, and 11B illustrate cross-sectional views along cross-section B-B, FIGS. 8B, 9B, 10B illustrate cross-sectional views along cross-section C-C, and FIG. 11A illustrates a cross-sectional view along cross-section A-A.

Figure 2:
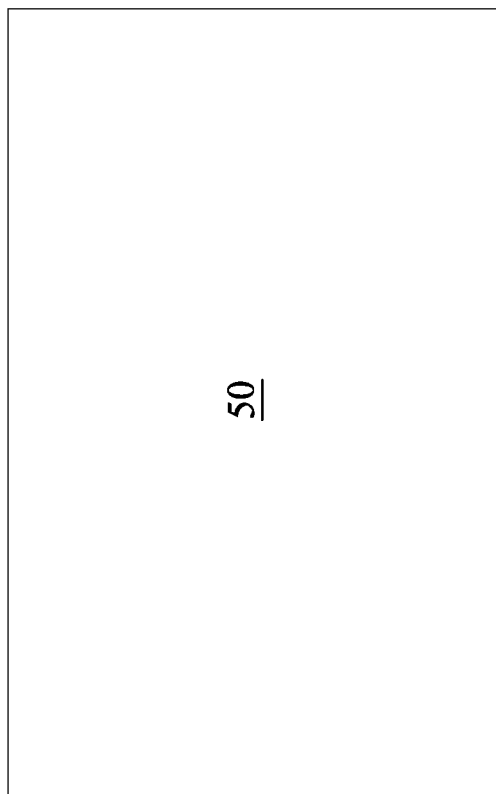
Figure 2:

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
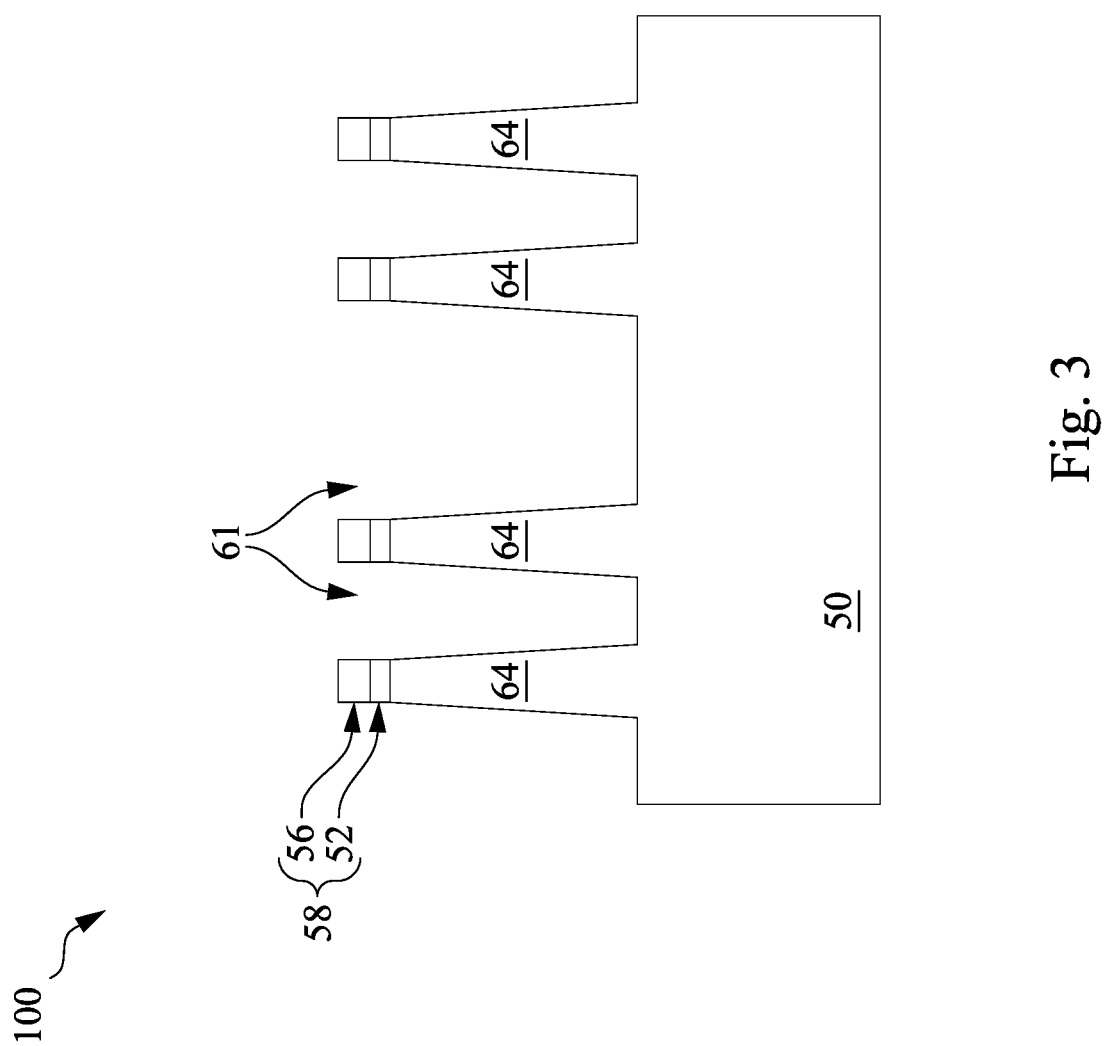

Referring next to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (may also be referred to as fins) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. After semiconductor fins 64 are formed, the patterned mask 58 may be removed by etching or any suitable method.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
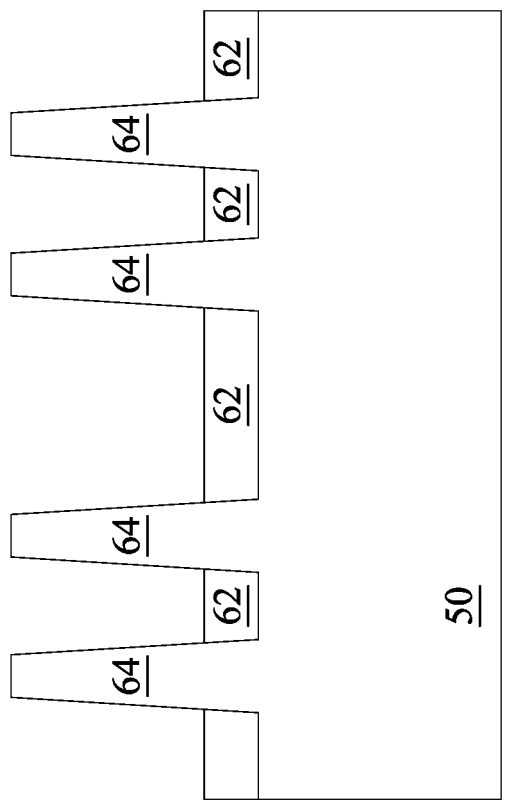

Next, FIG. 4 illustrates the formation of an insulation material between neighboring semiconductor fins 64 to form isolation regions 62. The insulation material may be an oxide (e.g., silicon oxide), a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed after the insulation material is formed. A planarization process, such as a chemical mechanical polish (CMP), may remove any excess insulation material (and, if present, the patterned mask 58) and form top surfaces of the isolation regions 62 and top surfaces of the semiconductor fins 64 that are coplanar (not shown).

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions. The isolation regions 62 are recessed such that the upper portions of the semiconductor fins 64 protrude from between neighboring isolation regions 62. The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor fins can be recessed, and a material different from the semiconductor fins may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
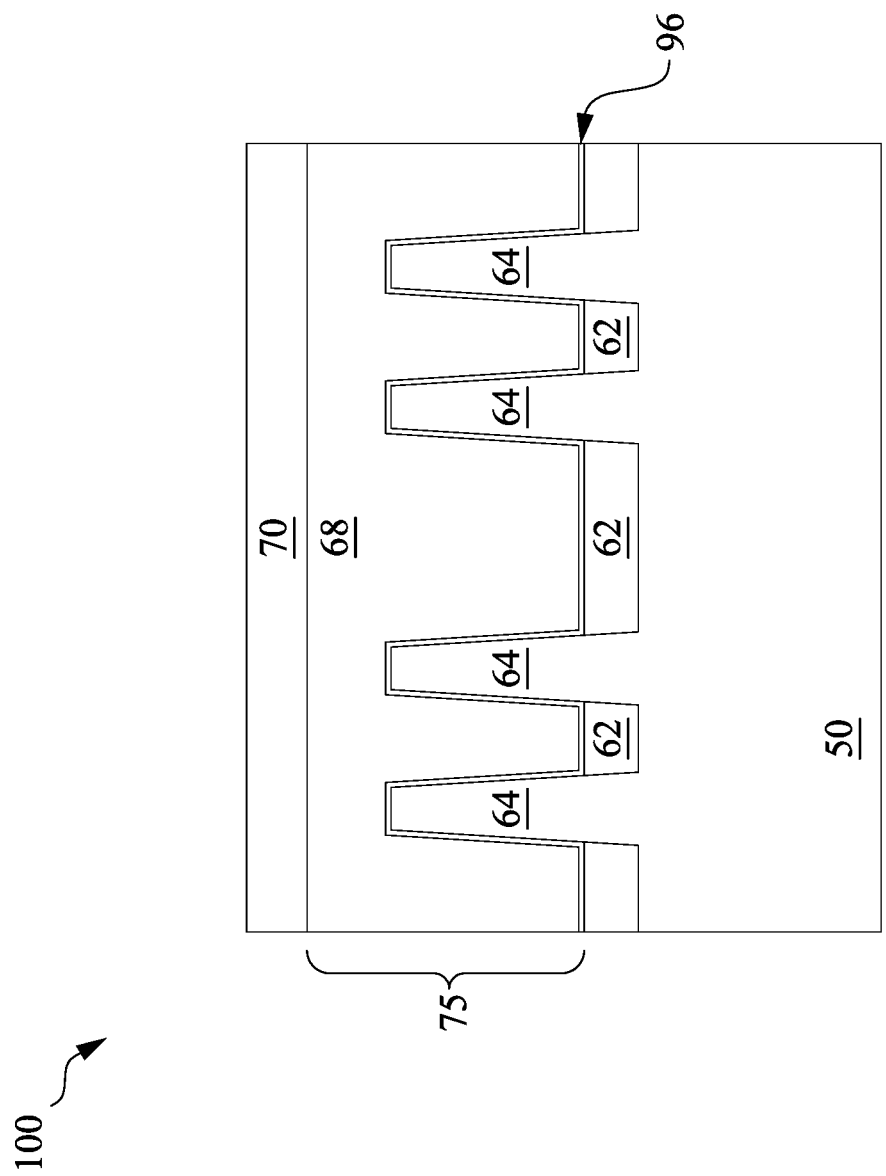

FIG. 5 illustrates the formation of a dummy gate structure 75 over the semiconductor fins 64. The dummy gate structure 75 includes gate dielectric 66 and gate 68, in some embodiments. The dummy gate structure 75 may be formed by patterning a mask layer, a gate layer and a gate dielectric layer, where the mask layer, the gate layer and the gate dielectric layer comprise a same material as the mask 70, the gate 68, and the gate dielectric 66, respectively. To form the dummy gate structure 75, the gate dielectric layer is formed on the semiconductor fins 64 and the isolation regions 62. The gate dielectric layer may be, for example, silicon oxide, silicon nitride, multilayers thereof, or the like, and may be deposited or thermally grown according to acceptable techniques. The formation methods of the gate dielectric layer may include molecular-beam deposition (MBD), atomic layer deposition (ALD), plasma-enhanced CVD (PECVD), and the like.

The gate layer is formed over the gate dielectric layer, and the mask layer is formed over the gate layer. The gate layer may be deposited over the gate dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the gate dielectric layer, the gate layer, and the mask layer are formed, the mask layer may be patterned using acceptable photolithography and etching techniques to form mask 70. The pattern of the mask 70 may then be transferred to the gate layer and the gate dielectric layer by a suitable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64. Although one gate structure 75 is illustrated in the cross-sectional view of FIG. 5, more than one gate structures 75 may be formed over the semiconductor fins 64.

FIG. 6A illustrates the cross-section view the FinFET device 100 along cross-section A-A (e.g., along a longitudinal axis of the fin) in a fabrication stage following the processing of FIG. 5. As illustrated in FIG. 6A, lightly doped drain (LDD) regions 65 are formed in the fins 64. The LDD regions 65 may be formed by an implantation process. The implantation process may implant N-type or P-type impurities in the fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 6A illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6A, after the LDD regions 65 are formed, gate spacers 87 are formed on the gate structure. In the example of FIG. 6A, the gate spacers 87 are formed on opposing sidewalls of the gate 68 and on opposing sidewalls of the gate dielectric 66. The gate spacers 87 may be formed of a nitride (e.g., silicon nitride), silicon oxynitride, silicon carbide, silicon carbonitride, the like, or a combination thereof, and may be formed using, e.g., a thermal oxidation, CVD, or other suitable deposition process. The gate spacers 87 may also extend over the upper surfaces of the semiconductor fins 64 and the upper surface of the isolation region 62.

The shapes and formation methods of the gate spacers 87 as illustrated in FIG. 6A are merely non-limiting examples, and other shapes and formation methods are possible. For example, the gate spacers 87 may include first gate spacers and second gate spacers (not shown separately). The first gate spacers may be formed on the opposing sidewalls of the gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 are formed. In some embodiments, dummy gate spacers are formed on the first gate spacers (not shown) before the epitaxial process of the epitaxial source/drain regions 80, and the dummy gate spacers are removed and replaced with the second gate spacers after the epitaxial source/drain regions 80 are formed. All such embodiments are fully intended to be included in the scope of the present disclosure.

Next, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 6A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80, as illustrated in FIG. 6B. In some embodiments, the source/drain regions 80 of adjacent fins 64 do not merge together and remain separate source/drain regions 80, as illustrated in FIG. 6C. Note that for simplicity, only two semiconductor fins 64 are illustrated in FIGS. 6B and 6C. In some example embodiments in which the resulting FinFET is an n-type FinFET, source/drain regions 80 comprise silicon carbide (SiC), silicon phosphorous (SiP), phosphorous-doped silicon carbon (SiCP), or the like. In other embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity (e.g., dopant) concentration in a range from about $1E19$ $cm^{-3}$ to about $1E21$ $cm^{-3}$. In some embodiments, the epitaxial source/drain regions may be in situ doped during growth.

Next, as illustrated in FIG. 7A, a first interlayer dielectric (ILD) 90 is formed over the structure illustrated in FIG. 6A, and a gate-last process (sometimes referred to as replacement gate process) is performed. In a gate-last process, the gate 68 and the gate dielectric 66 (see FIG. 6A), which are considered dummy gate and dummy gate dielectric, respectively, are removed and replaced with an active gate and an active gate dielectric, which may be collectively referred to as a replacement gate.

In some embodiments, the first ILD 90 is formed of a dielectric material such as silicon oxide ($SiO_2$), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as CMP, may be performed to remove the mask 70 and to planarize the top surface of the first ILD 90, such that the top surface of the first ILD 90 is level with the top surface of the gate 68 after the CMP process. Therefore, after the CMP process, the top surface of the gate 68 is exposed, in the illustrated embodiments.

In accordance with some embodiments, the gate 68 and the gate dielectric 66 directly under the gate 68 are removed in an etching step(s), so that recesses (not shown) are formed. Each recess exposes a channel region of a respective fin 64. Each channel region may be disposed between neighboring pairs of epitaxial source/drain regions 80. During the dummy gate removal, the dummy gate dielectric layer 66 may be used as an etch stop layer when the dummy gate 68 is etched. The dummy gate dielectric layer 66 may then be removed after the removal of the dummy gate 68.

Next, metal gates 97 are formed in the recesses by forming a gate dielectric layer 96, a barrier layer 94, and a gate electrode 98 successively in each of the recesses. As illustrated in FIG. 7A, the gate dielectric layer 96 is deposited conformally in the recesses. The barrier layer 94 is formed conformally over the gate dielectric layer 96, and the gate electrode 98 fills the recesses. Although not shown, a work function layer may be formed, e.g., between the gate dielectric layer 96 and the barrier layer 94.

In accordance with some embodiments, the gate dielectric layer 96 comprises silicon oxide, silicon nitride, or multilayers thereof. In some embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

The work function layer may be formed conformally over the gate dielectric layer 96. The work function layer comprises any suitable material for a work function layer. Exemplary p-type work function metals that may be included in the metal gate 97 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the metal gate 97 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a target threshold voltage Vt is achieved in the device that is to be formed in the respective region. The work function layer(s) may be deposited by CVD, PVD, ALD, and/or other suitable process.

Next, the barrier layer 94 is formed conformally over the gate dielectric layer 96 and, if present, over the work function layer. The barrier layer 94 may comprise an electrically conductive material such as titanium nitride, although other materials, such as tantalum nitride, titanium, tantalum, or the like, may alternatively be utilized. The barrier layer 94 may be formed using a CVD process, such as PECVD. However, other alternative processes, such as sputtering, MOCVD, or ALD, may alternatively be used.

Next, the gate electrode 98 is formed over the barrier layer 94. The gate electrode 98 may be made of a metal-containing material such as Cu, Al, W, the like, combinations thereof, or multi-layers thereof, and may be formed by, e.g., electroplating, electroless plating, PVD, CVD, or other suitable method. A planarization process, such as a CMP, may be performed to remove the excess portions of the gate dielectric layer 96, the work function layer, the barrier layer 94, and the material of the gate electrode 98, which excess portions are over the top surface of the first ILD 90. The resulting remaining portions of material of the gate electrode 98, the barrier layer 94, the work function layer, and the gate dielectric layer 96 thus form metal gates 97 of the resulting FinFET device 100. Three metal gates 97 (e.g., 97A, 97B, and 97C) are illustrated in the example of FIG. 7A. However, more or less than three metal gates 97 may be used to form the FinFET device 100, as skilled artisans readily appreciate.

FIG. 7B illustrates a plan view of the FinFET device 100 of FIG. 7A. For simplicity, not all features of the FinFET device 100 are illustrated. For example, the gate spacers 87, the isolation regions 62, and the source/drain regions 80 are not illustrated in FIG. 7B.

As illustrated in FIG. 7B, the metal gates 97 (e.g., 97A/97B/97C) straddle the semiconductor fins 64 (e.g., 64A/64B/64C/64D). In subsequent processing, a metal gate cutting process is performed to cut the metal gate 97B into two separate metal gates 97B_1 and 97B_2 (see, e.g., FIG. 11B). In the illustrated embodiment, a portion of the metal gate 97B in a cut area 55 is removed, thereby separating the metal gate 97B into two separate metal gates. In the illustrated embodiment, after the metal gate cutting process, portions of the metal gate 97B over the semiconductor fins 64A and 64B form a first metal gate, and portions of the metal gate 97B over the semiconductor fins 64C and 64D form a second metal gate. The first metal gate and the second metal gate may be controlled independently, e.g., by applying different control voltages to the first metal gate and the second metal gate.

FIG. 7B illustrates a non-limiting example of the cut area 55. The number of cut areas 55, the size of cut areas 55, and the location of cut areas 55 may be varied to achieve different cutting patterns and to form metal gates with different sizes and patterns. For example, the cut area 55 may be enlarged along cross-section C-C to cut the metal gates 97A and/or the metal gate 97C in one step with the metal gate 97B. As another example, a second cut area may be used along cross-section B-B, e.g., between semiconductor fins 64A and 64B, to cut the metal gates 97B into three separate metal gates that can be controlled independently from each other. These and other variations of the cut areas 55 are fully intended to be included within the scope of the present disclosure. Discussions below use the example of one cut area 55 as illustrated in FIG. 7B, with the understanding that any number of cut areas may be used in the fabrication of the FinFET device 100.

FIGS. 7C and 7D illustrate cross-sectional views of the FinFET device 100 of FIG. 7A, but along cross-section B-B and C-C, respectively. As illustrated in FIG. 7D, the metal gates 97 are disposed over the isolation regions 62 and the substrate 50. Gate spacers 87 are on opposing sidewalls of each metal gate 97. The first ILD 90 surrounds the metal gates 97 and the gate spacers 87. Since the cross-section C-C is outside the semiconductor fins 64, features such as the semiconductor fins 64, the source/drain regions 80, and the LDD regions 65 are not visible in the cross-sectional view of FIG. 7D.

Figure 8A:
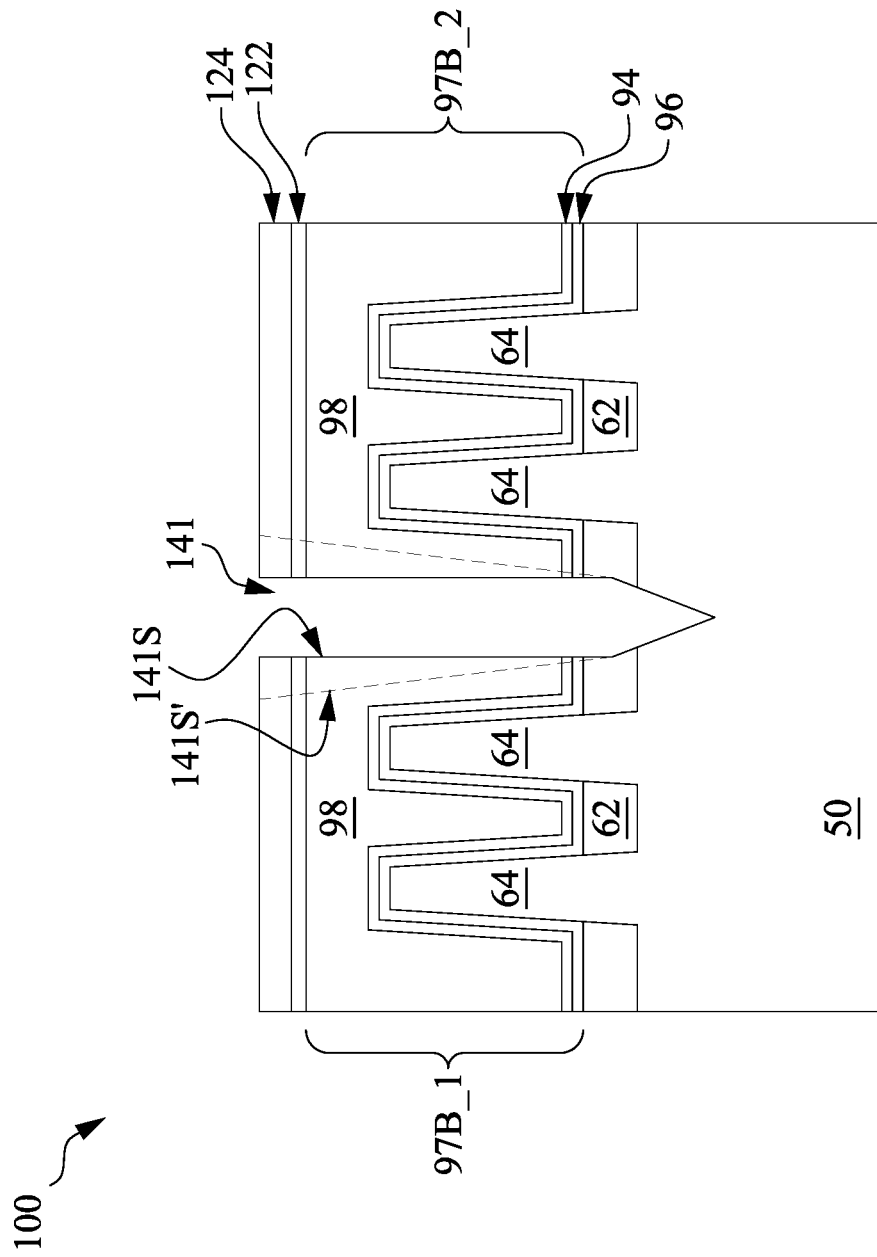
Figure 8B:
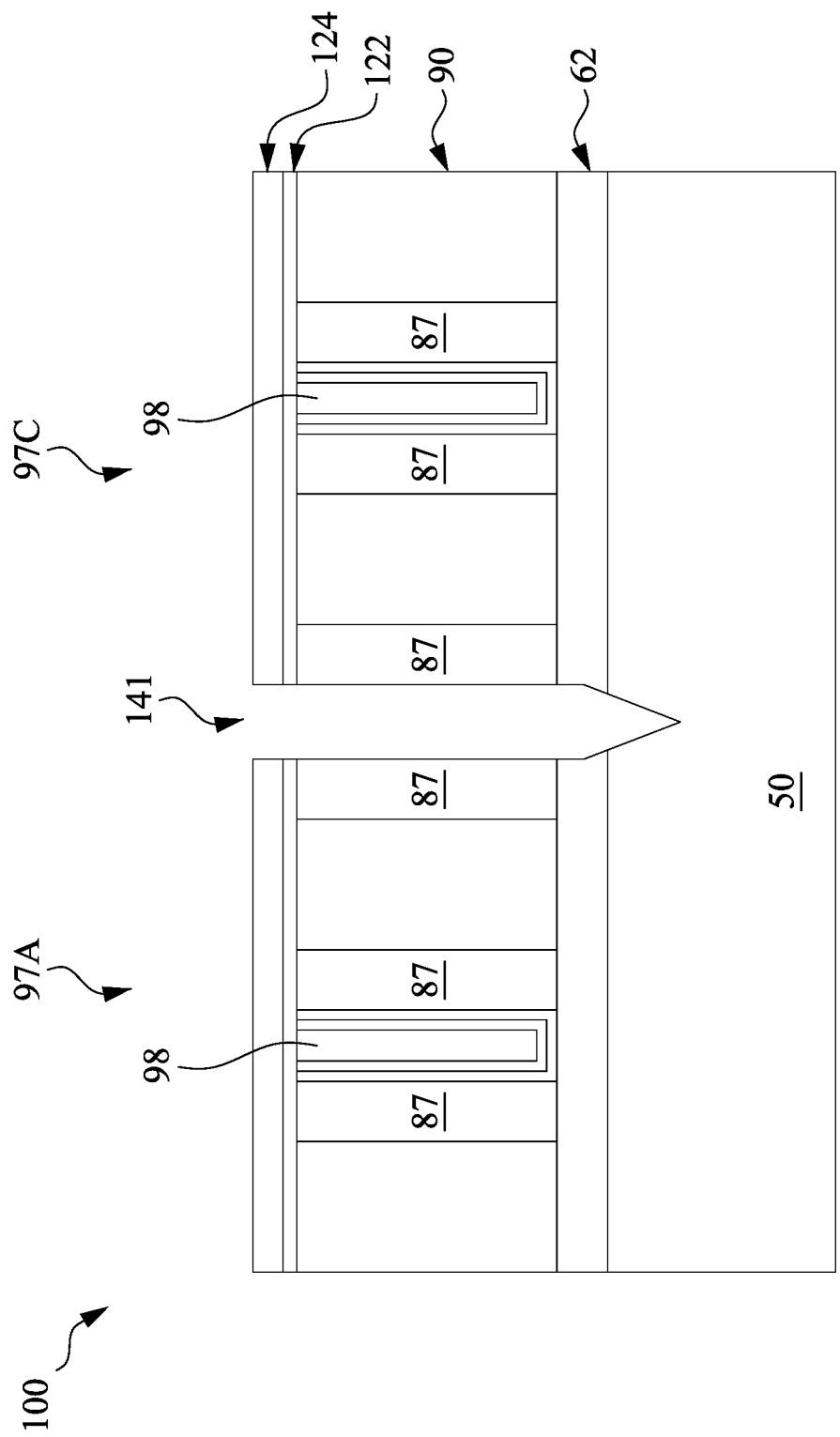

Next, in FIGS. 8A and 8B, a first hard mask layer 122 and a second hard mask layer 124 are formed successively over the first ILD 90. In some embodiments, the first hard mask layer 122 is a metal hard mask layer and the second hard mask layer 124 is a dielectric hard mask layer. In subsequent processing, a pattern is transferred onto the first hard mask layer 122 using various photolithography and etching techniques. The first hard mask layer 122 may then be used as an etching mask for etching the underlying structure (e.g., metal gates 97). The first hard mask layer 122 may be a masking material such as titanium nitride, titanium oxide, the like, or a combination thereof. The first hard mask layer 122 may be formed using a process such as ALD, CVD, PVD, the like, or a combination thereof.

The second hard mask layer 124 is deposited over the first hard mask layer 122. The second hard mask layer 124 may be used as a masking pattern for the first hard mask layer 122. In subsequent processing steps, the second hard mask layer 124 is patterned to form patterns which may then be transferred to the first hard mask layer 122. The second hard mask layer 124 may be a masking material such as silicon nitride, silicon oxide, tetraethyl orthosilicate (TEOS), SiOxCy, the like, or a combination thereof. The second hard mask layer 124 may be formed using a process such as CVD, ALD, the like, or a combination thereof. In an example embodiment, the first hard mask layer 122 comprises titanium nitride, and the second hard mask layer 124 comprises silicon nitride.

Next, a patterned photoresist layer is formed over the first hard mask layer 122 and the second hard mask layer 124. A pattern (e.g., opening) in the patterned photoresist layer corresponds to the location of the opening 141. The pattern in the photoresist layer is transferred to the first hard mask layer 122 and the second hard mask layer 124 using suitable methods, such as one or more anisotropic etching processes. As a result, a pattern (e.g., opening) is formed in the first hard mask layer 122 and the second hard mask layer 124, which pattern exposes a portion of the metal gate 97B within the cut area 55 (see FIG. 7B).

Next, as illustrated in FIGS. 8A and 8B, portions of the metal gate 97B within the cut area 55 (see FIG. 7B) and exposed by the patterned first hard mask layer 122 and second hard mask layer 124 are removed. A suitable etching process, such as an anisotropic etching process, may be performed to remove the exposed portions of the metal gate 97B. After the portions of the metal gate 97B within the cut area 55 are removed, an opening 141 is formed. The opening 141 extends through the metal gate 97B, and separates the metal gate 97B into two separate gate structures 97B_1 and 97B_2. In the illustrated example, the opening 141 extends into the isolation region 62, and a bottom of the opening 141 further extends into the substrate 50. In some embodiments, a width of the opening 141, measured between opposing sidewalls of the opening 141, is between about 10 nm and about 45 nm, and a depth of the opening 141, measured between the upper surface of the gate electrode 98 and the bottom of the opening 141, is between about 150 nm and about 300 nm.

The shape and the depth of the opening 141 illustrated in FIGS. 8A and 8B are non-limiting examples, other shapes and depths for the opening 141 are also possible, and are fully intended to be included within the scope of the present disclosure. For example, the opening 141 may extend into the isolation region 62 but not into the substrate 50. As another example, the opening 141 may be wider than illustrated in the FIGS. 8A and 8B, such that portions of the gate spacers 87 along the removed portions of the metal gate 97B are also removed by the anisotropic etching process (e.g., a plasma process). As yet another example, the cross-section of the opening 141 is illustrated as having a V-shaped bottom in FIGS. 8A and 8B, although other shapes for the bottom portion of the opening 141, such as a U-shape or a rectangular shape, are also possible. The opening 141 in the example of FIG. 8A has straight sidewalls 141S that extend vertically (e.g., perpendicular to the major upper surface of the substrate 50). In some embodiments, the opening 141 has slanted sidewalls 141S' (illustrated in dashed lines in FIG. 8A) such that a distance between opposing sidewalls of the opening 141 decreases as the opening 141 extends toward the substrate 50. In other words, the opening 141 with the slanted sidewall 141S' is wider at the top (e.g., proximate to the upper surface of the metal gate 97 distal from the substrate 50) than at the bottom. For simplicity, the opening 141 is shown as having straight sidewalls 141S in subsequent drawings, with the understanding that the opening 141 may have slanted sidewalls 141S'.

Figure 9A:
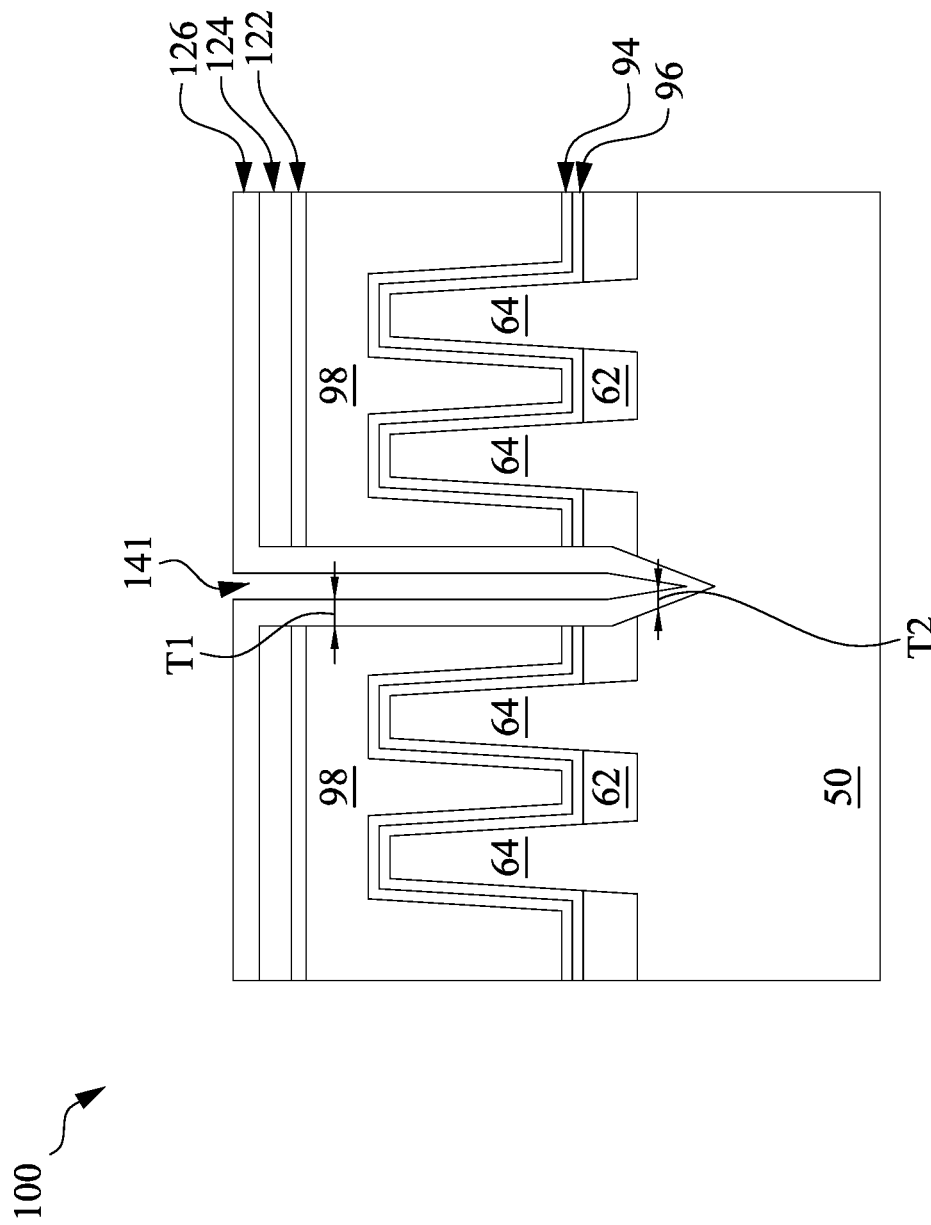
Figure 9B:
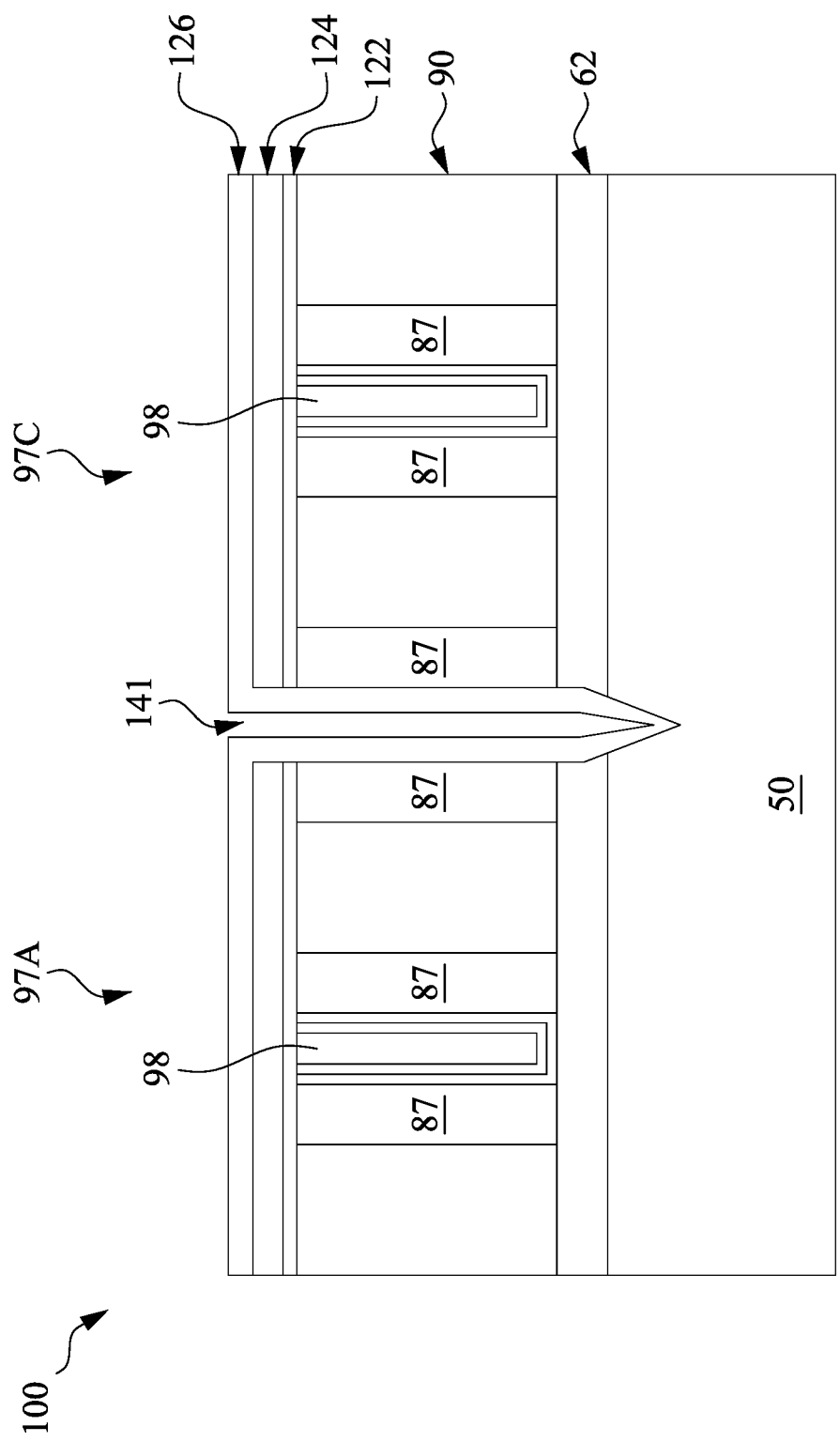

Next, in FIGS. 9A and 9B, a dielectric layer 126 is formed to line sidewalls and the bottom of the opening 141. The dielectric layer 126 may also cover the upper surface of the second hard mask layer 124. In some embodiments, the dielectric layer 126 is formed to be a non-conformal layer, such that a thickness of the dielectric layer 126 decreases (e.g., continuously) as the dielectric layer 126 extends toward the bottom of the opening 141. As illustrated in FIGS. 9A, the dielectric layer 126 has a thickness T1 at a first sidewall location proximate to the upper surface of the gate electrode 98, and has a thickness T2 at a second sidewall location proximate to the bottom of the opening 141, where T1 is larger than T2. In some embodiments, the thickness T1 is between about 55 angstroms and about 70 angstroms, and the thickness T2 is between about 30 angstroms and about 55 angstroms. In some embodiments, the thickness T2 is between about 55% and about 80% of the thickness T1 (e.g., 0.55 T1<T2<0.8 T1). An average thickness of the dielectric layer 126 (e.g., average of measurements at the top and the bottom of the opening 141) may be between about 3.5 nm and about 7 nm, as an example.

In the illustrated embodiments, the dielectric layer 126 is formed of a dielectric material having a dielectric constant (also referred to as K value) higher than the dielectric constant of a subsequently formed dielectric layer 128 (see FIGS. 10A and 10B). For example, the dielectric layer 126 may be formed of silicon nitride which has a K value between about 6.5 and about 8, and the subsequently formed dielectric layer 128 may be formed of silicon oxide which has a K value between about 3.5 and about 5.

In some embodiments, the non-conformal dielectric layer 126 comprises silicon nitride, and is formed by a plasma-enhanced atomic layer deposition (PEALD) process. Note that while PEALD processes in general are used to form conformal layers, the disclosed embodiment herein uses a novel PEALD process to form the non-conformal dielectric layer 126. In some embodiments, a single wafer comprising a plurality of the FinFET devices 100 of FIG. 8A is positioned in the processing chamber for the PEALD process. In other words, only one wafer is processed each time in the processing chamber by the disclosed PEALD process. In some embodiments, one or more wafers, where each wafer comprises a plurality of the FinFET devices 100 of FIG. 8A, are positioned in the processing chamber for the PEALD process.

In some embodiments, the PEALD process to form the non-conformal dielectric layer 126 includes multiple cycles (also referred to as processing cycles), where each cycle includes four steps (also referred to as four processing steps). In the first step of each cycle, a first precursor, such as dichlorosilane ($SiH_2Cl_2$) or diiodosilane ($SiH_2I_2$), is fed into the processing chamber. The first precursor may be carried into the processing chamber by a carrier gas, such as nitrogen ($N_2$). A flow rate of the first precursor and the carrier gas may be between about 5 standard liter per minute (slm) and about 30 slm, such as 9 slm, and the first precursor and the carrier gas may be fed into the processing chamber for about 0.1 second to about 5 second. The volume mixing ratio for the first precursor (e.g., $SiH_2Cl_2$ or $SiH_2I_2$) and $N_2$ may be between about 0.01 and about 0.1. A temperature for the first processing step may be between about 300° C. and about 450° C., such as 450° C., and a pressure for the first processing step may be between about 0 torr and about 30 torr.

After the first step is finished, the second step (also referred to as a purge step) is performed, where the un-used (e.g., un-reacted) first precursor and by-products of the first step are pumped out of the processing chamber.

Next, in the third step, a second precursor, such as a plasma of $NH_3$ or plasmas of $N_2$ and $H_2$, is fed into the processing chamber. A flow rate of the second precursor (e.g., $NH_3$ plasma, or $N_2/H_2$ plasmas) may be between about 5 slm and about 10 slm. A temperature for the third step may be between about 300° C. and about 450° C., and a pressure for the third step may be between about 0 torr and about 30 torr. A power of the RF source for the PEALD process is between about 500 W and about 800 W, and the RF source is turned ON between about 1 second and about 30 seconds.

Next, in the fourth step, another purge step is performed, such that the un-used second precursor and by-products of the third step are pumped out of the processing chamber. After the first cycle of the PEALD process is finished, a layer of silicon nitride is formed. Additional cycles of the PEALD process may be performed, until a target thickness of the deposited material is reached.

Figure 10A:
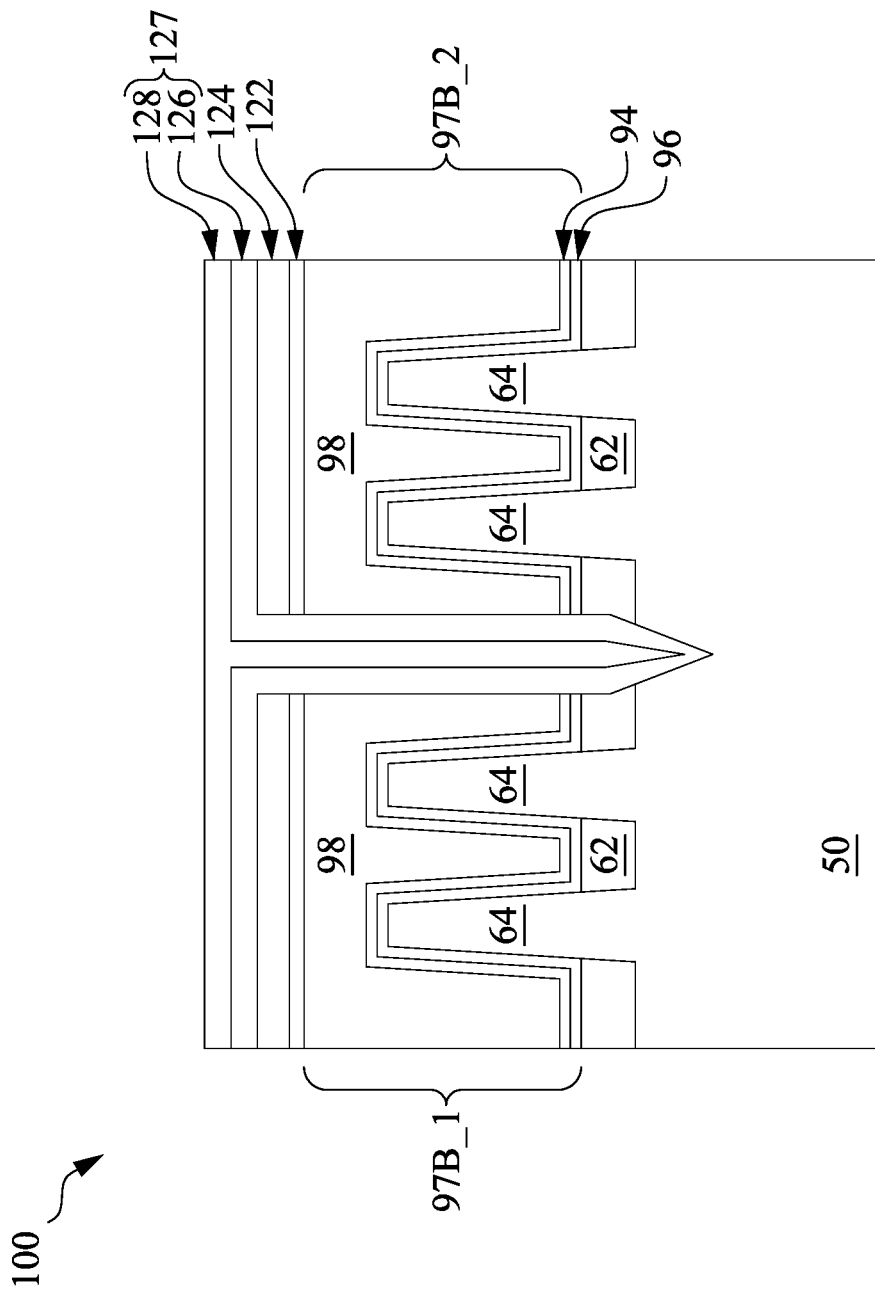
Figure 10B:
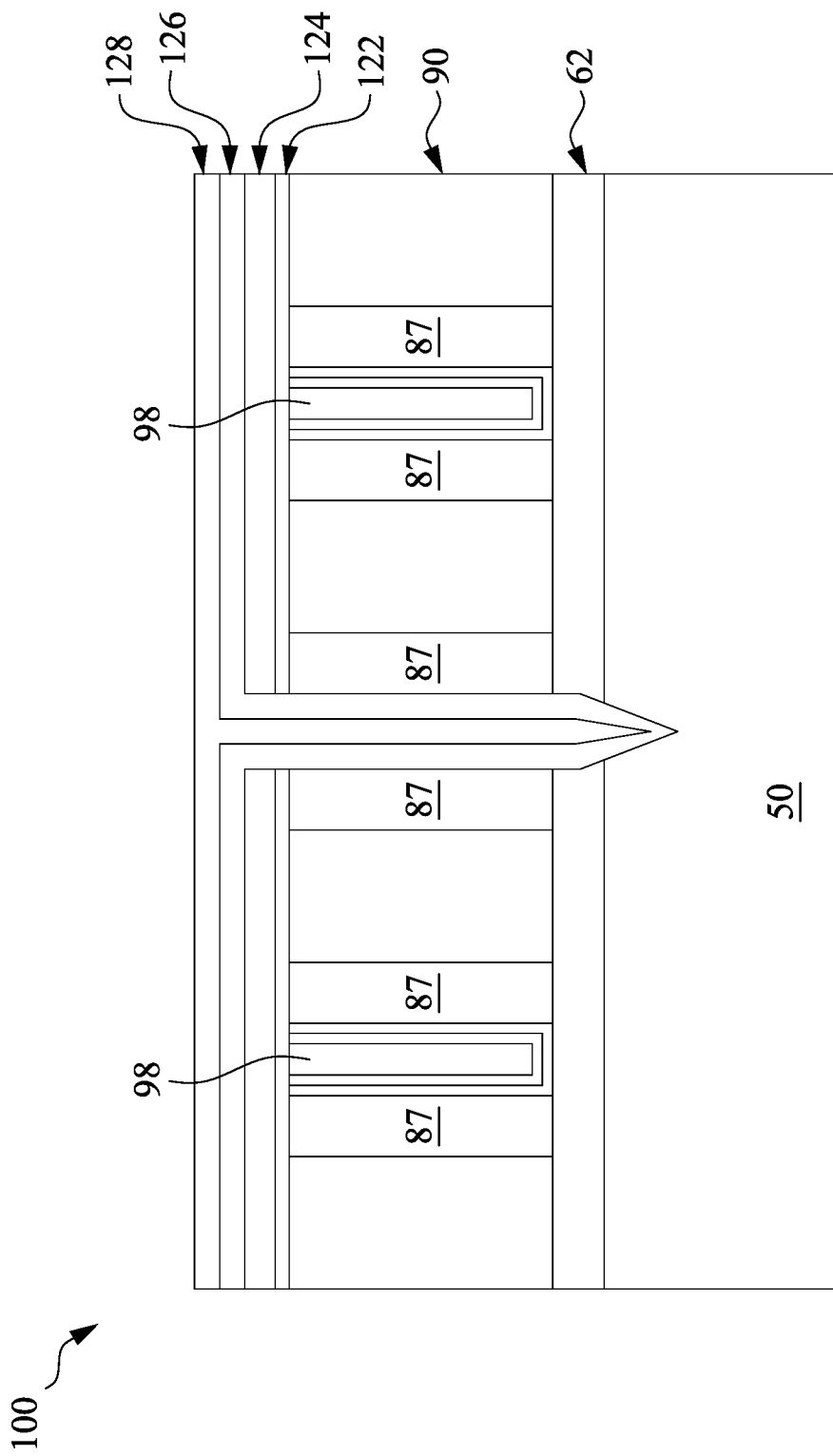
Figure 11A:
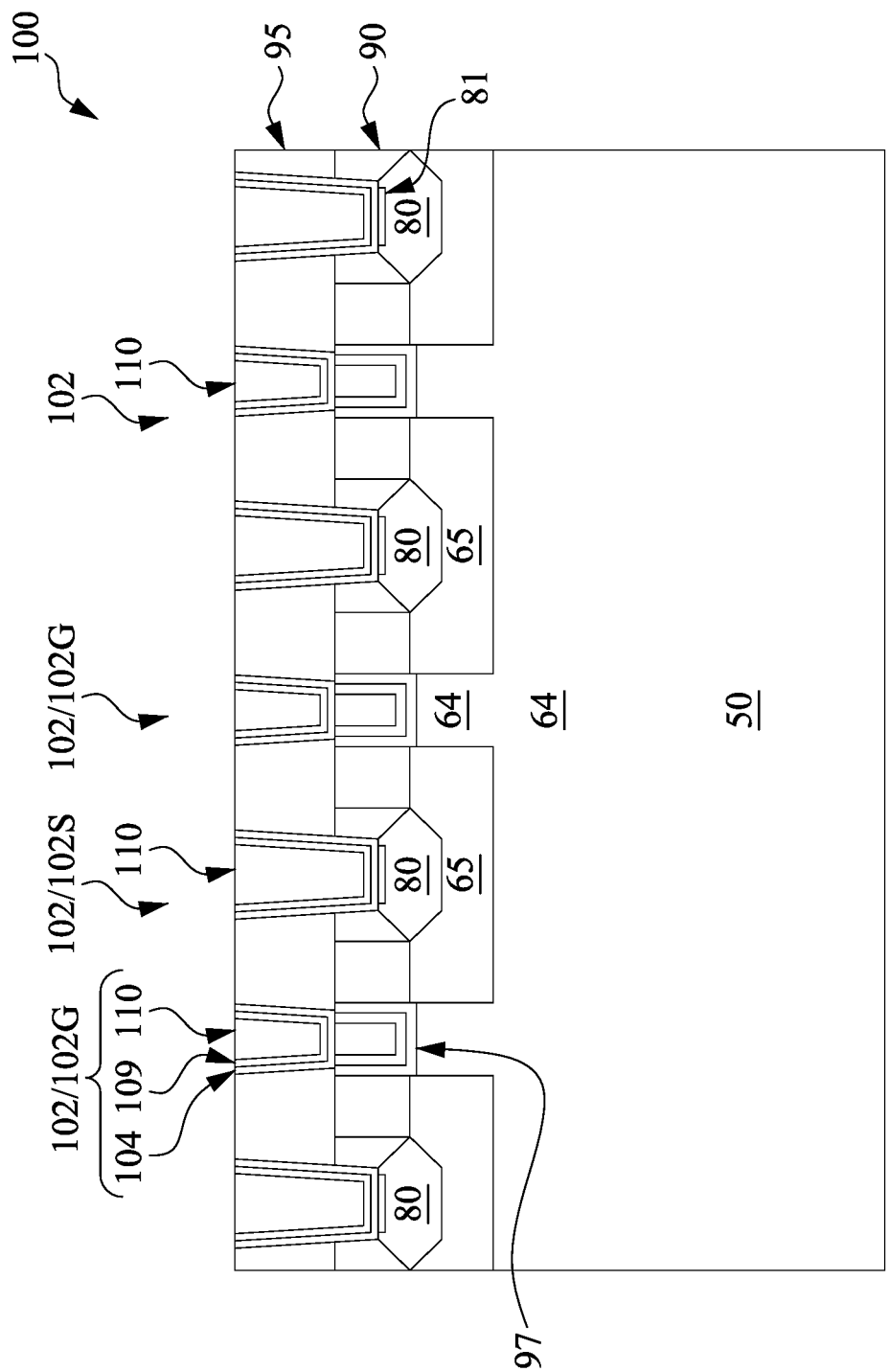

Next, in FIGS. 10A and 10B, a dielectric layer 128 is formed over the dielectric layer 126 and fills the opening 141. In the illustrated embodiments, the dielectric layer 128 is formed of a dielectric material different from the dielectric material of the dielectric layer 126, and the dielectric constant of the dielectric layer 128 is smaller than that of the dielectric layer 126.

In some embodiments, the dielectric layer 128 is formed of silicon oxide, and is formed by a PEALD process. The dielectric layer 128 may be formed in a same processing chamber as that for the dielectric layer 126, although different processing chamber may be used for forming the dielectric layer 128. In some embodiments, a single wafer comprising a plurality of the FinFET devices 100 of FIG. 9A is positioned in the processing chamber for the PEALD process to form the dielectric layer 128. In other words, only one wafer is processed each time in the processing chamber. In some embodiments, one or more wafers, where each wafer comprises a plurality of the FinFET devices 100 of FIG. 9A, are positioned in the processing chamber for the PEALD process.

In some embodiments, the PEALD process to form the dielectric layer 128 includes multiple cycles, with each cycle having four processing steps, similar to the PEALD processing discussed above. The four processing steps includes a first step where a first precursor is supplied to the processing chamber, a second step to pump out gases in the processing chamber, a third step where a second precursor is supplied to the processing chamber, and a fourth step to pump out gases in the processing chamber.

In some embodiments, the first precursor for forming the dielectric layer 128 (e.g., silicon oxide), such as N-(diethylaminosilyl)-N-ethylethanamine ($C_8H_{22}N_2Si$), is fed into the processing chamber in the first processing step. The first precursor may be carried into the processing chamber by a carrier gas, such as argon (Ar). A flow rate of the first precursor and the carrier gas may be between about 2 slm and about 30 slm, such as 2 slm, and the first precursor and the carrier gas may be fed into the processing chamber for about 0.1 second to about 10 second. The mixing ratio for the first precursor and the carrier gas may be between about 0.01 and about 0.1. A temperature for the first processing step may be about 150° C. to about 400° C., such as 260° C., and a pressure for the first processing step may be between about 0 torr and about 30 torr.

In some embodiments, the second precursor for forming the dielectric layer 128, such as a plasma of $O_2$, is fed into the processing chamber in the third processing step. In some embodiments, the second precursor is $O_2$ gas. A flow rate of the second precursor may be between about 0.5 slm and about 20 slm. A temperature for the third step may be between about 150° C. and about 400° C., and a pressure for the third step may be between about 0 torr and about 30 torr. The second precursor may be supplied for about 0.5 second to about 30 seconds. A power of the RF source for the PEALD process is between about 15 W and about 100 W, and the RF source is turned ON for about 1 minute.

In the example discussed above, the dielectric layer 126 (e.g., SiN) and the dielectric layer 128 (e.g., $SiO_2$) form an insulating film stack 127 with a dual-layered structure. The insulating film stack 127 functions as a gap-filling insulating structure that separates the metal gate 97B into two separate metal gates 97B_1 and 97B-2. Besides the example materials discussed above, other suitable material(s) may be used in the film stack. For example, the dielectric layer 128 may be formed of SiCN, SiOC, SiOCN, or the like. In some embodiments, the insulating film stack 127 includes more than two layers of dielectric materials. For example, the dielectric layer 128 may be replaced by a plurality of dielectric layers (may also be referred to as a plurality of sublayers of dielectric materials) with a lower overall (e.g., average) K value than the dielectric layer 126. The plurality of sublayers of dielectric materials may include layers of different materials, such as layers of SiCN, SiOC, SiOCN, or the like. The overall (e.g., average) K value of the plurality of sublayers of dielectric materials in the dielectric layer 128 is lower than the K value of the dielectric layer 126. As an example, all of the dielectric materials in the plurality of sublayers of dielectric materials have K values smaller than that of the dielectric layer 126. As another example, some sublayers of dielectric materials in the dielectric layer 128 may have K values larger than the K value of the dielectric layer 126, but the overall K value of all of the sublayers of dielectric materials is lower than the K value of the dielectric layer 126 (e.g., due to other sublayers of dielectric material having lower K values than the dielectric layer 126). In some embodiments, the insulating film stack 127 may include an air gap to further reduce the K value. The air gap may be formed by, e.g., selectively removing one of the plurality of dielectric layers with lower K values using a wet etch process.

Compared with a gap-filling insulating structure formed of a single layer of SiN, the disclosed insulating film stack 127 has a lower overall (e.g., average) K value due to the use of low K dielectric material in the insulating film stack 127, which reduces the RC delay of the device formed. In addition, compared with a gap-filling insulating structure having a conformal SiN layer (e.g., having a uniform thickness) and a $SiO_2$ layer over the conformal SiN layer, the disclosed insulating film stack 127 not only reduces RC delay, but also reduces the variation of threshold voltage Vt for the device formed, as discussed hereinafter. In some embodiments, the opening 141 formed is wider at the top (e.g., proximate to the upper surface of the gate electrode 98) and narrower at the bottom. The parasitic capacitance between the metal gates 97B_1 and 97B_2 at the top portion of the metal gates is reduced by the larger distance between the metal gates 97B_1 and 97B_2, but the thicker dielectric layer 126 (e.g., SiN) with a high K value, which increases the overall K value (e.g., average K value) of the portion of the insulating film stack 127 at the top portion of the metal gates, compensates for the reduction of parasitic capacitance due to larger distance. Conversely, at the bottom of the opening 141, the parasitic capacitance between the metal gates 97B_1 and 97B_2 is increased by the smaller distance between the metal gates, but the thinner dielectric layer 126, which reduces the overall K value of the portion of the insulating film stack 127 at the bottom of the opening 141, compensates for the increase in the parasitic capacitance by the reduced distance. As a result, the parasitic capacitance between the metal gates 97B_1 and 97B_2 has a balanced (e.g., substantially uniform) value from the top of the metal gates to the bottom of the metal gates. The balanced parasitic capacitance value helps to reduce the threshold voltage variation, e.g., along a direction from the top surface of the metal gates 97B_1/97B_2 to the bottom surface of the metal gates 97B_1/97B_2.

Figure 11B:
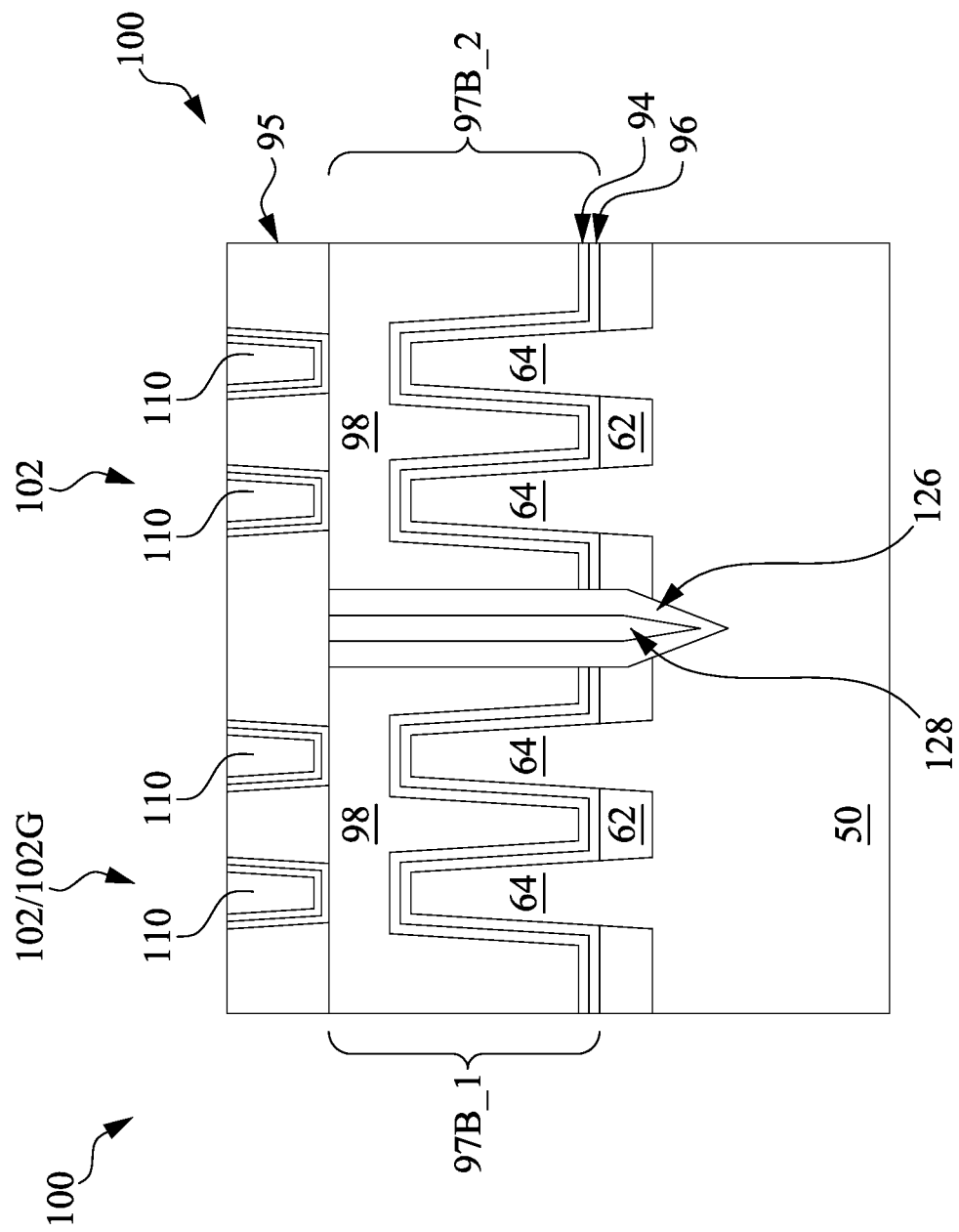

Next, in FIGS. 11A and 11B, a planarization process, such as CMP, is performed to remove the first hard mask layer 122, the second hard mask layer 124, and portions of the dielectric layers 126/128 disposed over the upper surface of the gate electrodes 98. Note that the cross-sectional view of FIG. 11A is along cross-section A-A, and the cross-section view of FIG. 11B is along cross-section B-B.

Next, contacts 102 (e.g., gate contacts 102G and source/drain contacts 102S) are formed over and electrically coupled to the metal gates 97 or source/drain regions 80. To form the contacts 102, a second ILD 95 is formed over the first ILD 90. In some embodiments, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Next, contact openings are formed through the first ILD 90 and/or the second ILD 95 to expose the source/drain regions 80 and the metal gates 97, which contact openings are then filled with electrically conductive material(s) to form the contacts 102. In some embodiments, silicide regions 81 are formed over the source/drain regions 80 before the contact openings are filled. Details of forming the contacts 102 are discussed hereinafter.

In some embodiments, silicide regions 81 are formed over the source/drain regions 80. Silicide regions 81 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 80, then performing a thermal anneal process to form the silicide regions 81. The unreacted portions of the deposited metal are then removed, e.g., by an etching process. Although regions 81 are referred to as silicide regions, regions 81 may also be germanide regions, or silicon germanide regions (e.g., regions comprising silicide and germanide).

Next, a barrier layer 104 is formed lining sidewalls and bottoms of the contact openings, over the silicide regions 81, and over the upper surface of the second ILD 95. The barrier layer 104 may comprise titanium nitride, tantalum nitride, titanium, tantalum, the like, and may be formed by ALD, PVD, CVD, or other suitable deposition method. Next, a seed layer 109 is formed over the barrier layer 104. The seed layer 109 may be deposited by PVD, ALD or CVD, and may be formed of tungsten, copper, or copper alloys, although other suitable methods and materials may alternatively be used. Once the seed layer 109 has been formed, a conductive material 110 may be formed on the seed layer 108, filling and overfilling the contact openings. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Once the contact openings have been filled, excess portions of the barrier layer 104, seed layer 109, and conductive material 110 outside of the contact openings may be removed through a planarization process such as CMP, although any suitable removal process may be used. Contacts 102 are thus formed in the contact openings. The contacts 102 are illustrated in a single cross-section as an example, the contacts 102 could be in different cross-sections. In addition, in FIG. 11B, two contacts 102 are shown connected to each of the two metal gate 97B_1 and 97B_2 as an example. The number and the location of the contacts 102 connected to each of the metal gates 97B_1 and 97B_2 may be changed without departing from the spirit of the present disclosure, these and other modifications are fully intended to be included within the scope of the present disclosure.

Figure 12:
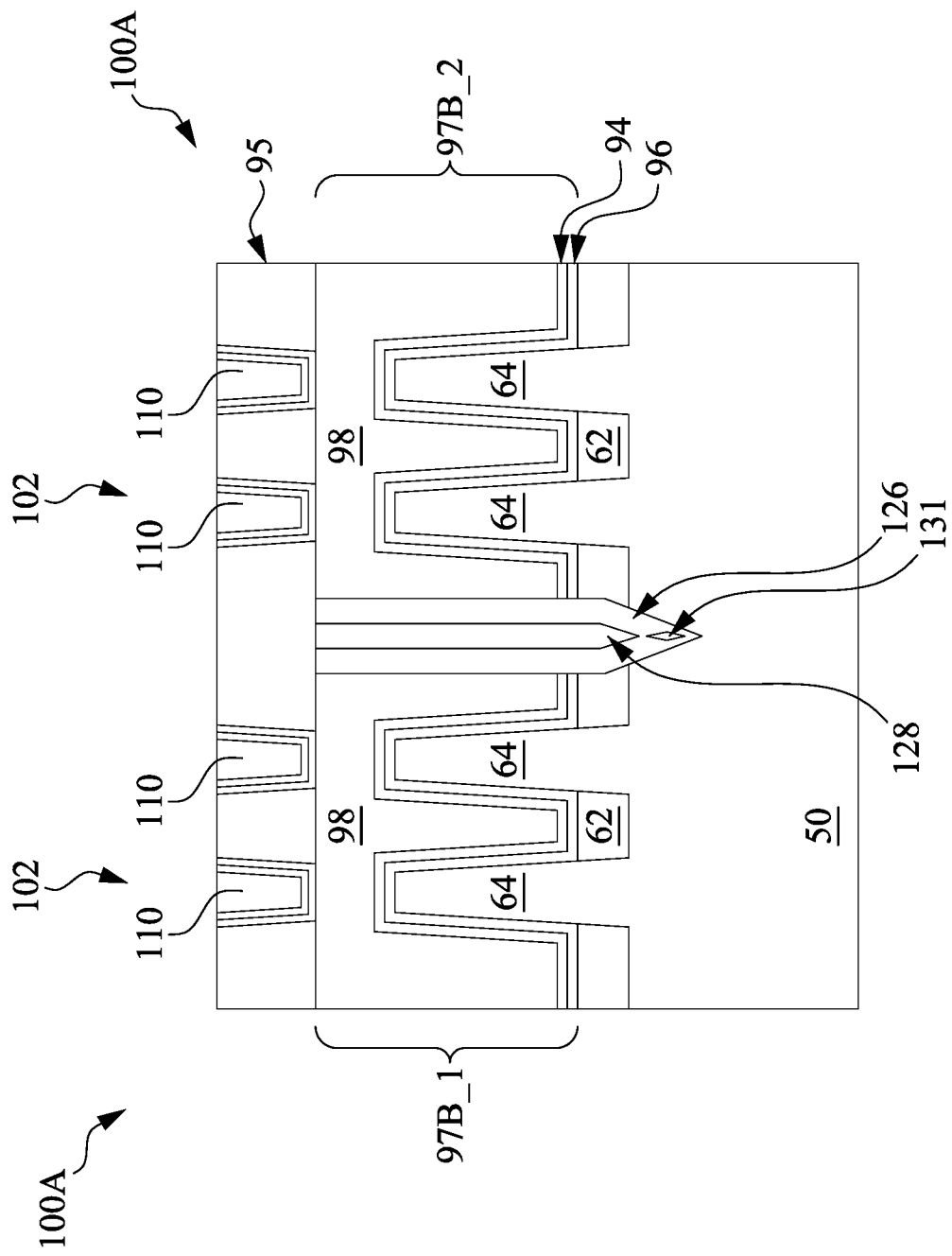
FIG. 12 illustrates a cross-section view of a FinFET device, in accordance with another embodiment.

FIG. 12 illustrates a cross-section view of a FinFET device 100A, in accordance with another embodiment. The FinFET device 100A is similar to the FinFET device 100 of FIGS. 11A and 11B, but with one or more air gaps 131 formed in the dielectric layer 126 proximate to the bottom of the opening 141. The air gap 131 may be a sealed cavity in the dielectric layer 126, and be formed due to, e.g., the size of the opening 141, the thickness of the dielectric layer 126, the material used for the dielectric layer 126, and/or the process conditions used when forming the dielectric layer 126. The air gap 131 may further reduce the K value of the portion of the dielectric layer 126 proximate to the bottom of the opening 141. The cross-sectional view of the FinFET device 100A of FIG. 12 along cross-section A-A is the same as FIG. 11A, in some embodiments.

FIGS. 13A, 13B, 14A, 14B, and 15 illustrate cross-sectional views of a FinFET device 100B at various stages of fabrication, in accordance with another embodiment. The processing of FIGS. 13A and 13B may follow the processing step of FIGS. 8A and 8B. In other words, FIGS. 2-5, 6A-6C, 7A-7D, 8A, 8B, 13A, 13B, 14A, 14B, and 15 illustrate the processing steps of the FinFET device 100B, in some embodiments.

Figure 13A:
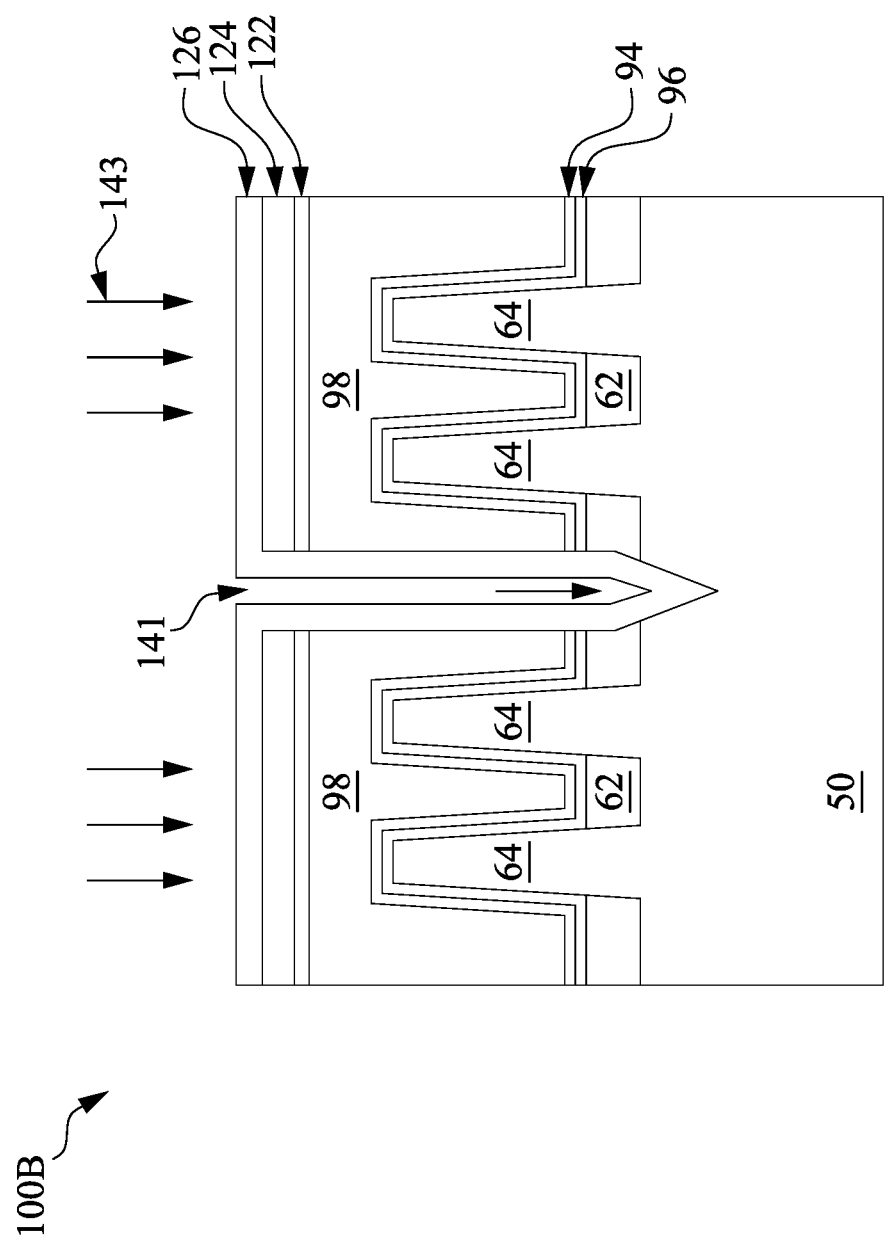
FIGS. 13A, 13B, 14A, 14B, and 15 illustrate cross-sectional views of a FinFET device at various stages of fabrication, in accordance with another embodiment.
Figure 13B:
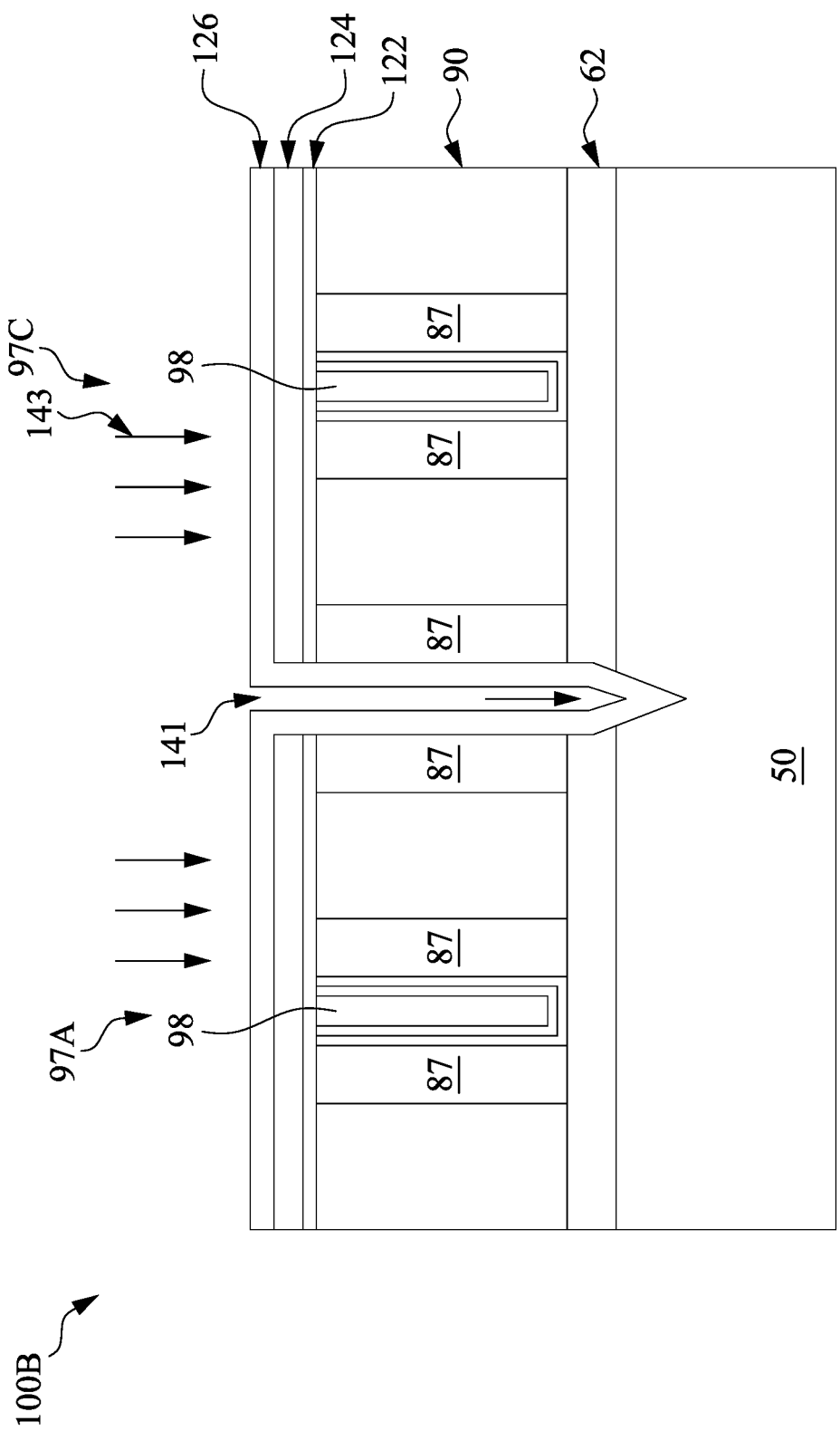

Referring to FIGS. 13A and 13B, the dielectric layer 126 (e.g., SiN) is formed to line the sidewalls and the bottom of the opening 141. In some embodiments, the dielectric layer 126 is formed to be a conformal layer using, e.g., an ALD deposition process. In some embodiments, the dielectric layer 126 is formed to be a non-conformal layer, e.g., using the PEALD deposition process described above with reference to FIGS. 9A and 9B. In embodiments where the dielectric layer 126 is formed to be a non-conformal layer, the cross-sectional views of the dielectric layer 126 at this stage of processing may be the same as or similar to those illustrated in FIGS. 9A and 9B (or FIG. 12).

Next, a plasma process 143 is performed to treat (e.g., damage) portions of the dielectric layer 126. In some embodiments, the plasma process is an anisotropic plasma etching process. The plasma process may be performed using a gas source comprising $NF_3$, $O_2$, $CH_3F$, combinations thereof, or the like. A power of the RF source for the plasma etching process is between about 50 W and about 800 W, and the RF source is turned ON for about 1 second to about 100 seconds. Due to the anisotropicity of the plasma process, the plasma process bombards horizontal portions of the dielectric layer 126 (e.g., portions of the dielectric layer 126 proximate to the bottom of the opening 141), which horizontal portions are damaged by the plasma process. In some embodiments, the plasma process changes the physical properties (e.g., reduces hardness and/or densities) of the damaged portions of the dielectric layer 126, such that the portions of the dielectric layer 126 proximate to the bottom of the opening 141 are easily removed by a subsequently performed etching process.

Figure 14A:
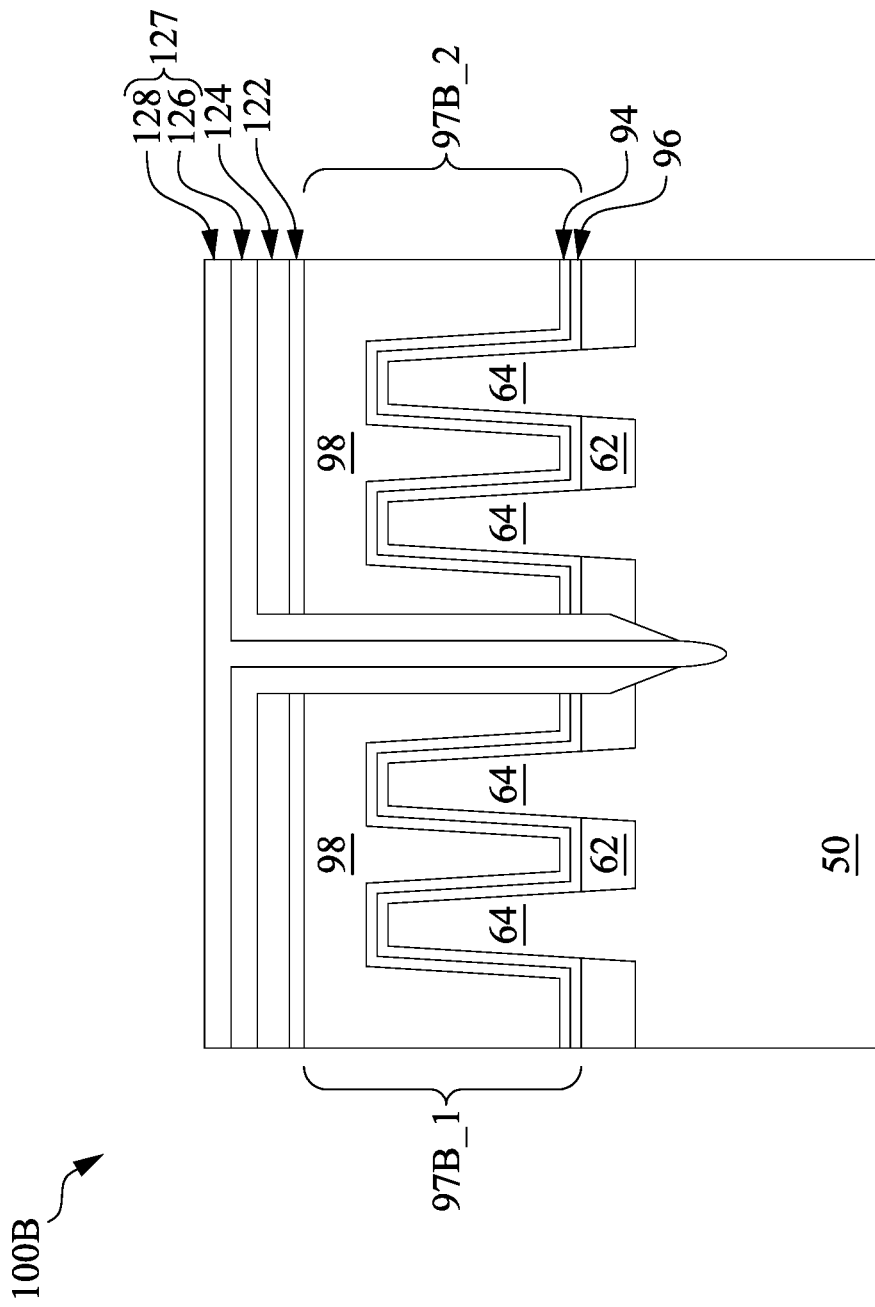
Figure 14B:
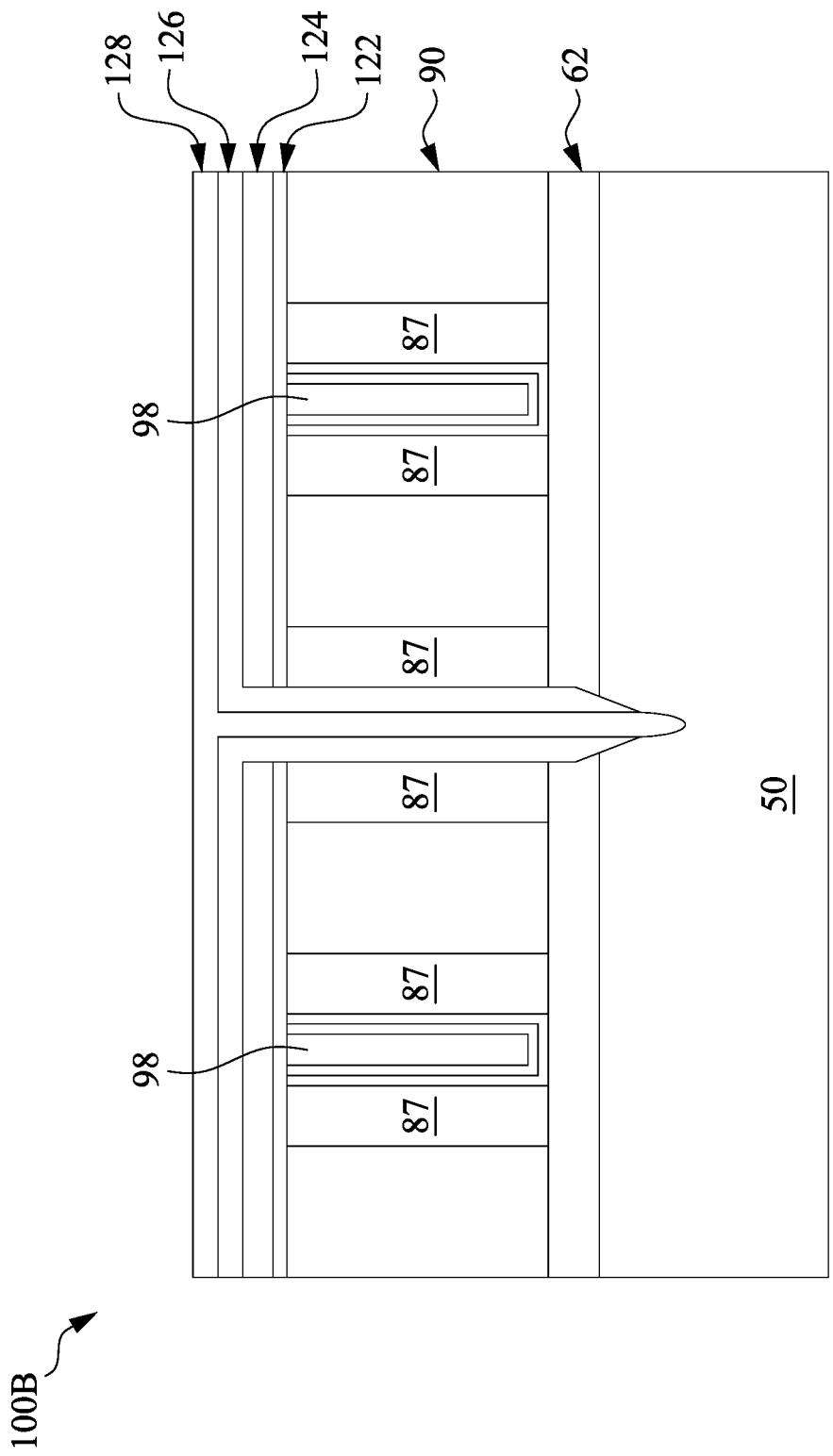

Next, in FIGS. 14A and 14B, an etching process, such as a wet etch process, is performed to remove the portions of the dielectric layer 126 treated (e.g., damaged, and/or loosened) by the plasma process 143. In some embodiments, the etching process is a wet etch process performed using dHF acid as the etchant. A dilute ratio between hydrofluoric acid and de-ionized water in the dHF acid may be between 1:50 and 1:200. A duration for the wet etch process may be between about 60 seconds and about 180 seconds. In some embodiments, the wet etch process completely removes portions of the dielectric layer 126 proximate to the bottom of the opening 141. In some embodiments, the thickness of the dielectric layer 126 proximate to the bottom of the opening 141 is reduced by the wet etch process, and a thin layer of dielectric layer 126 still remains at the bottom of the opening 141.

By removing (or reducing the thickness of) the bottom portion of the dielectric layer 126 using the wet etch process, the volume of the dielectric layer 126 is reduced at the bottom of the opening 141, and more space is available for the subsequently formed dielectric layer 128. Since the dielectric layer 126 (e.g., SiN) has a higher K value than the dielectric layer 128 (e.g., $SiO_2$), the overall K value of the insulating film stack 127 (which includes dielectric layers 126 and 128) at the bottom of the opening 141 is reduced, which reduces the RC delay and may also help to balance the parasitic capacitance between the metal gates 97B_1 and 97B_2, which in turn reduces the variation of threshold voltage Vt. In addition, by removing (or reducing the thickness of) the bottom portion of the dielectric layer 126 (e.g., SiN), the fixed charges in the dielectric layer 126 at the bottom of the opening 141 is avoided or reduced, which advantageously reduces device leakage.

Next, the dielectric layer 128 (e.g., $SiO_2$, SiCN, SiOC, SiOCN, the like, or multi-layers thereof) is formed over the dielectric layer 126 and fills the opening 141. The dielectric layer 128 may be formed using the same precursors and the same formation method (e.g., PEALD) as the dielectric layer 128 in FIGS. 10A and 10B, thus details are not repeated. Note that in the illustrated embodiment, since bottom portions of the dielectric layer 126 is removed by the wet etch process, the dielectric layer 128 in the opening 141 extends deeper from the upper surface of the gate electrodes 98 toward the substrate 50 than the dielectric layer 126. In other words, the dielectric layer 126 covers upper sidewalls of the dielectric layer 128 in the opening 141, and lower sidewalls of the dielectric layer 128 in the opening 141 are exposed by the dielectric layer 126. In the example of FIGS. 14A and 14B, the bottom portion of the dielectric layer 128 extends into, and physically contacts, the substrate 50. Depending on, e.g., the depth of the opening 141 and the dimensions of the removed bottom portions of the dielectric layer 126, the bottom portion of the dielectric layer 128 may also physically contact the isolation regions 62 (see, e.g., FIG. 16).

Figure 15:
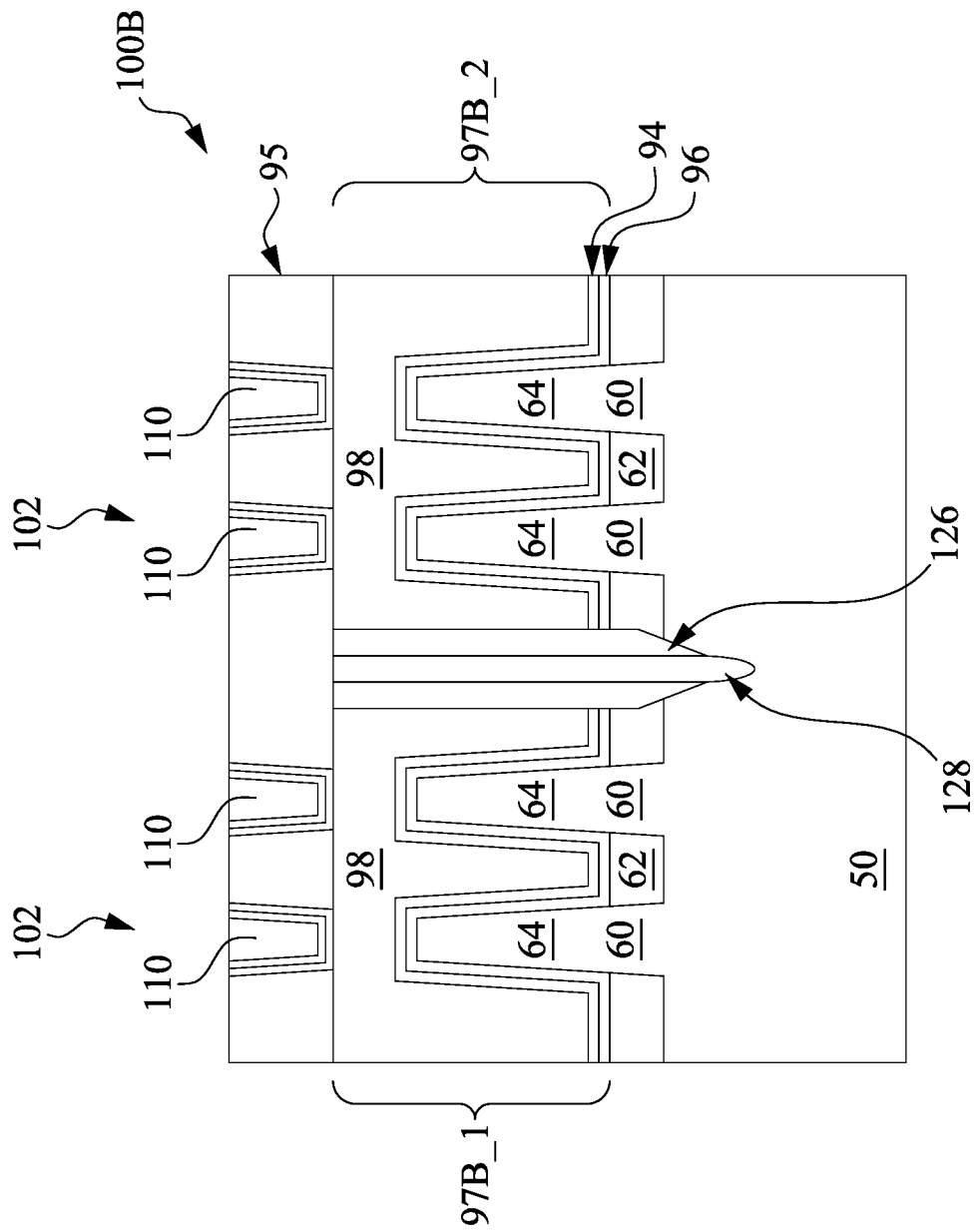

Next, in FIG. 15, a planarization process, such as CMP, is performed to remove portions of the dielectric layers 126 and 128 from the upper surfaces of the gate electrodes 98.

Next, the second ILD 95 is formed over the gate electrodes 98, and contacts 102 are formed to electrically couple to respective underlying electrically conductive features, such as metal gates 97B_1/97B_2, or source/drain regions 80. Processing is the same as or similar to those discussed above with reference to FIGS. 11A and 11B, thus details are not repeated. The cross-sectional view of FIG. 15 is along cross-section B-B. The corresponding cross-sectional view of FIG. 15 along cross-section A-A is the same as or similar to FIG. 11A.

Figure 16:
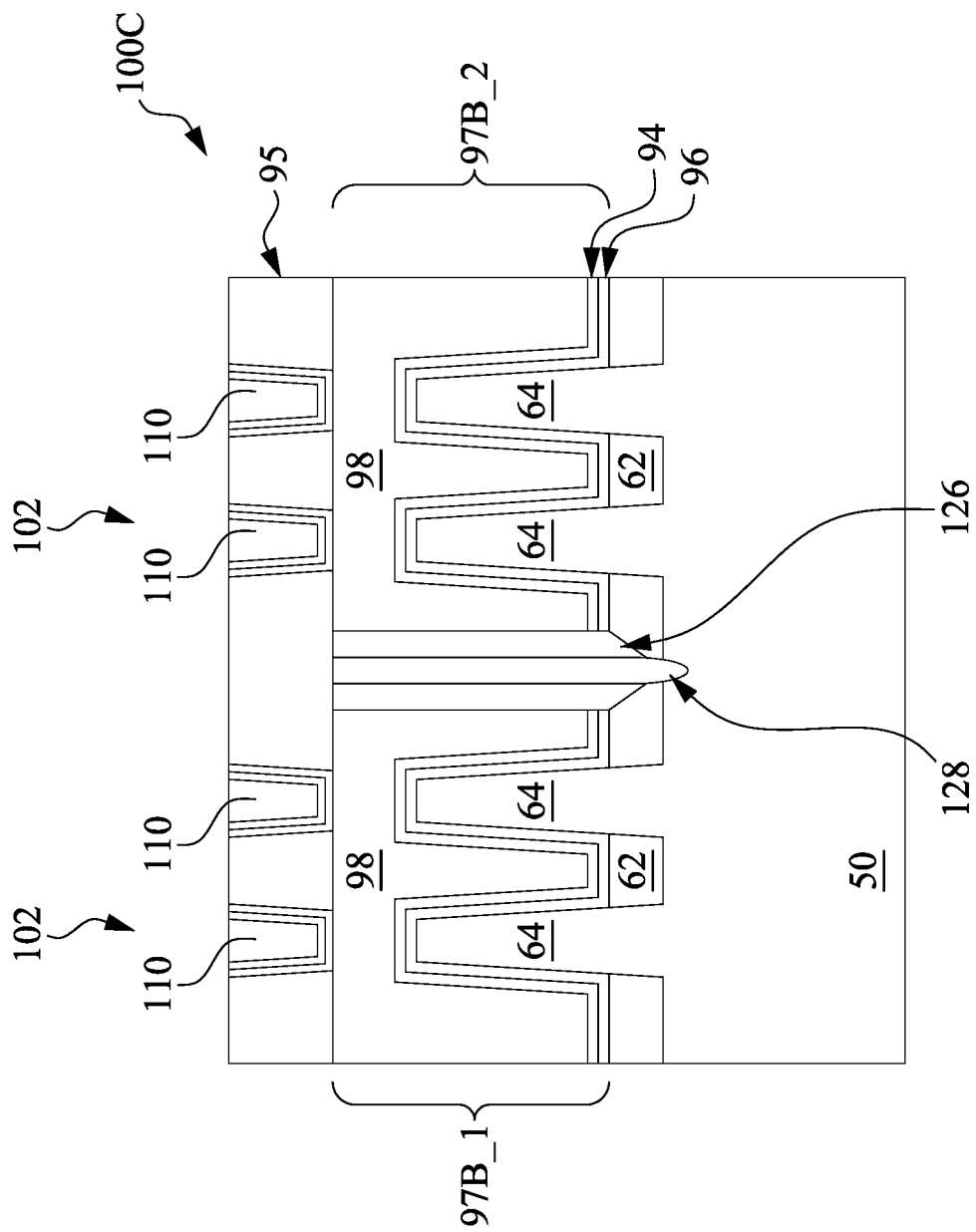
FIG. 16 illustrates a cross-section view of a FinFET device, in accordance with yet another embodiment.

FIG. 16 illustrates a cross-section view of a FinFET device 100C, in accordance with yet another embodiment. The FinFET device 100C is similar to the FinFET device of FIG. 15, but the bottom portion of the dielectric layer 128 physically contacts the substrate 50 and the isolation regions 62.

Figure 17:
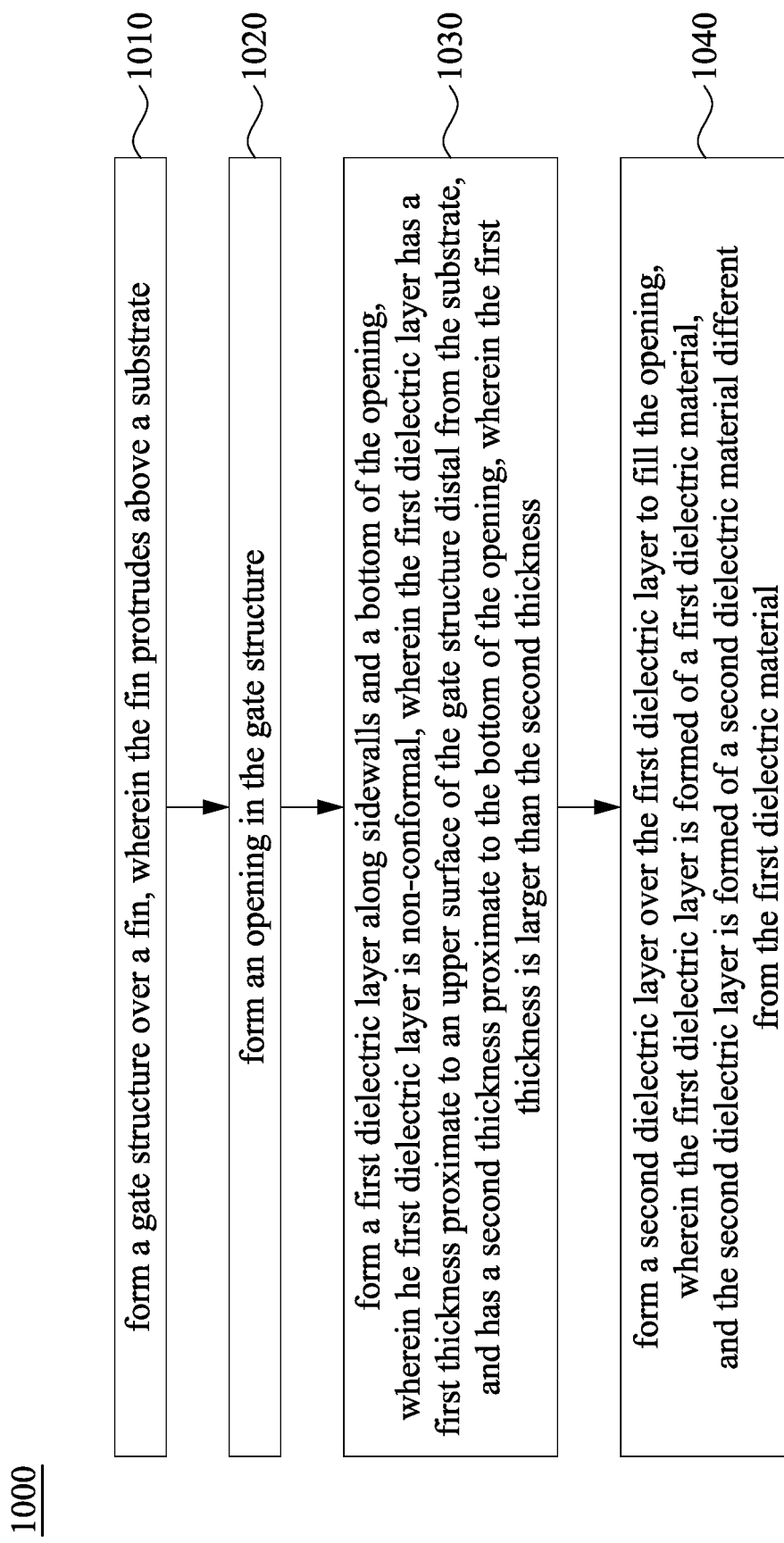
FIG. 17 illustrates a flow chart of a method of fabricating a semiconductor device, in accordance with some embodiments.

FIG. 17 illustrates a flow chart of a method of fabricating a semiconductor device, in accordance with some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged and repeated.

Referring to FIG. 17, at block 1010, a gate structure is formed over a fin, wherein the fin protrudes above a substrate. At block 1020, an opening is formed in the gate structure. At block 1030, a first dielectric layer is formed along sidewalls and a bottom of the opening, wherein the first dielectric layer is non-conformal, wherein the first dielectric layer has a first thickness proximate to an upper surface of the gate structure distal from the substrate, and has a second thickness proximate to the bottom of the opening, wherein the first thickness is larger than the second thickness. At block 1040, a second dielectric layer is formed over the first dielectric layer to fill the opening, wherein the first dielectric layer is formed of a first dielectric material, and the second dielectric layer is formed of a second dielectric material different from the first dielectric material.

Embodiments may achieve advantages. The various disclosed embodiments, by forming a non-conformal dielectric layer 126, and/or by removing (or reducing a thickness of) bottom portions of the dielectric layer 126, reduces the overall dielectric constant of the insulating film stack 127, thus reducing the RC delay. In addition, the disclosed embodiments may also help to balance the parasitic capacitance between neighboring metal gates (e.g., 97B_1 and 97B_2), which reduces the threshold voltage variation. Furthermore, by removing (or reducing a thickness of) bottom portions of the dielectric layer 126, the fixed charges in the dielectric layer 126 at the bottom of the openings 141 is avoided or reduced, which reduces the device leakage.

In an embodiment, a method for forming a semiconductor device includes: forming a gate structure over a fin, wherein the fin protrudes above a substrate; forming an opening in the gate structure; forming a first dielectric layer along sidewalls and a bottom of the opening, wherein the first dielectric layer is non-conformal, wherein the first dielectric layer has a first thickness proximate to an upper surface of the gate structure distal from the substrate, and has a second thickness proximate to the bottom of the opening, wherein the first thickness is larger than the second thickness; and forming a second dielectric layer over the first dielectric layer to fill the opening, wherein the first dielectric layer is formed of a first dielectric material, and the second dielectric layer is formed of a second dielectric material different from the first dielectric material. In an embodiment, the opening extends through the gate structure and separates the gate structure into two separate structures. In an embodiment, a first dielectric constant of the first dielectric material is higher than a second dielectric constant of the second dielectric material. In an embodiment, the first dielectric material is silicon nitride, and the second dielectric material is silicon dioxide. In an embodiment, the second thickness is between about 55% and about 80% of the first thickness. In an embodiment, an air gap is formed in the first dielectric layer proximate to the bottom of the opening. In an embodiment, the method further includes, after forming the first dielectric layer and before forming the second dielectric layer: treating the first dielectric layer with a plasma process; and after treating the first dielectric layer, removing a lower portion of the first dielectric layer from the bottom of the opening. In an embodiment, the plasma process is an anisotropic plasma etching process. In an embodiment, removing the lower portion of the first dielectric layer comprises performing a wet etch process to remove the lower portion of the first dielectric layer. In an embodiment, after forming the second dielectric layer, upper sidewalls of the second dielectric layer are covered by the first dielectric layer, and lower sidewalls of the second dielectric layer are free of the first dielectric layer.

In an embodiment, a method for forming a semiconductor device includes: forming an electrically conductive feature over a substrate; forming an opening in the electrically conductive feature; lining sidewalls and a bottom of the opening with a first dielectric material; treating a bottom portion of the first dielectric material disposed at the bottom of the opening; removing the bottom portion of the first dielectric material after the treating; and after the removing, filling the opening by forming a second dielectric material over the first dielectric material. In an embodiment, the first dielectric material is different from the second dielectric material. In an embodiment, the second dielectric material comprises a plurality of sublayers of dielectric materials, and a first dielectric constant of the first dielectric material is higher than an overall dielectric constant of the second dielectric material. In an embodiment, the opening separates the electrically conductive feature into two separate structures. In an embodiment, treating the bottom portion of the first dielectric material comprises treating the bottom portion of the first dielectric material using a plasma process. In an embodiment, removing the bottom portion of the first dielectric material comprises performing a wet etch process to remove the bottom portion of the first dielectric material. In an embodiment, the first dielectric material is non-conformal, wherein the first dielectric material is thicker at a first sidewall location than at a second sidewall location, wherein the first sidewall location is proximate to an upper surface of the electrically conductive feature facing away from the substrate, and the second sidewall location is proximate to the bottom of the opening.

In an embodiment, a semiconductor device includes: a substrate; a first fin and a second fin that protrude above the substrate; a first gate structure over the first fin; a second gate structure over the second fin; and an insulating film stack between and contacting the first gate structure and the second gate structure, wherein the insulating film stack comprises: a second dielectric material; and a first dielectric material around the second dielectric material, wherein the first dielectric material extends along a first sidewall of the first gate structure and a second sidewall of the second gate structure, wherein a first dielectric constant of the first dielectric material is higher than a second dielectric constant of the second dielectric material. In an embodiment, the first dielectric material is non-conformal, wherein an upper portion of the first dielectric material distal from the substrate has a first thickness, wherein a lower portion of the first dielectric material closest to the substrate has a second thickness smaller than the first thickness. In an embodiment, the first dielectric material covers upper sidewalls of the second dielectric material distal from the substrate, wherein lower sidewalls of the second dielectric material proximate to the substrate are free of the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    forming a gate structure over a first fin and over a second fin, wherein the first fin and the second fin protrude above a substrate;
    forming an opening in the gate structure between the first fin and the second fin;
    lining sidewalls and a bottom of the opening with a first dielectric layer, wherein the first dielectric layer has a first thickness proximate to an upper surface of the gate structure distal from the substrate, and has a second thickness proximate to the bottom of the opening, wherein the first thickness is larger than the second thickness; and
    forming a second dielectric layer over the first dielectric layer to fill the opening, wherein the first dielectric layer is formed of a first dielectric material, and the second dielectric layer is formed of a second dielectric material different from the first dielectric material.

2. The method of claim 1, wherein the opening is formed to extend from the upper surface of the gate structure into an isolation region between the first fin and the second fin.

3. The method of claim 1, wherein the first dielectric material has a higher dielectric constant than the second dielectric material.

4. The method of claim 1, further comprising forming an air gap in the first dielectric layer proximate to the bottom of the opening.

5. The method of claim 1, further comprising, after forming the first dielectric layer and before forming the second dielectric layer:
    treating a bottom portion of the first dielectric layer disposed at the bottom of the opening to change a physical property of the bottom portion of the first dielectric layer; and
    after treating the bottom portion of the first dielectric layer, removing the bottom portion of the first dielectric layer from the bottom of the opening.

6. The method of claim 5, wherein treating the bottom portion of the first dielectric layer comprises performing a plasma process to treat the first dielectric layer.

7. The method of claim 6, wherein the plasma process is an anisotropic plasma etching process.

8. The method of claim 5, wherein the second dielectric layer extends deeper into the substrate than the first dielectric layer.

9. The method of claim 8, wherein upper sidewalls of the second dielectric layer are covered by the first dielectric layer, and lower sidewalls of the second dielectric layer are exposed by the first dielectric layer.

10. The method of claim 1, wherein the second thickness is between about 55% and about 80% of the first thickness.

11. A method for forming a semiconductor device, the method comprising:
    forming an electrically conductive feature over a substrate;
    forming an opening in the electrically conductive feature;
    lining sidewalls and a bottom of the opening with a first dielectric material;
    performing a plasma process to treat the first dielectric material;
    removing a bottom portion of the first dielectric material at the bottom of the opening after the plasma process; and
    after the removing, filling the opening by forming a second dielectric material over the first dielectric material.

12. The method of claim 11, wherein a first dielectric constant of the first dielectric material is larger than a second dielectric constant of the second dielectric material.

13. The method of claim 12, wherein the first dielectric material is formed to be a non-conformal layer.

14. The method of claim 13, wherein the first dielectric material is thicker at a first sidewall location than at a second sidewall location, wherein the first sidewall location is proximate to an upper surface of the electrically conductive feature facing away from the substrate, and the second sidewall location is proximate to the bottom of the opening.

15. The method of claim 11, wherein the opening separates the electrically conductive feature into two separate structures.

16. The method of claim 15, wherein the first dielectric material and the second dielectric material form an insulating film stack that electrically isolates the two separate structures.

17. The method of claim 11, wherein removing the bottom portion of the first dielectric material comprises performing a wet etch process to remove the bottom portion of the first dielectric material.

18. A semiconductor device comprising:
    a substrate;
    a first fin and a second fin that protrude above the substrate;
    a first gate structure over the first fin;
    a second gate structure over the second fin; and
    an insulating film stack between and separating the first gate structure and the second gate structure, wherein the insulating film stack comprises:
        a second dielectric material; and
        a first dielectric material around the second dielectric material, wherein the first dielectric material extends along a first sidewall of the first gate structure and a second sidewall of the second gate structure, wherein the first dielectric material is different from the second dielectric material, wherein an upper portion of the first dielectric material distal from the substrate has a first thickness, wherein a lower portion of the first dielectric material closest to the substrate has a second thickness smaller than the first thickness.

19. The semiconductor device of claim 18, wherein the first dielectric material surrounds upper portions of the second dielectric material distal from the substrate, wherein lower portions of the second dielectric material extend deeper into the substrate than the first dielectric material.

20. The semiconductor device of claim 18, further comprising an air gap in the first dielectric material, wherein the air gap underlies the second dielectric material.

* * * * *